(12) United States Patent
Yamamoto et al.

(10) Patent No.: US 12,038,757 B2
(45) Date of Patent: *Jul. 16, 2024

(54) MARKER DETECTION SYSTEM AND METHOD OF OPERATING MARKER DETECTION SYSTEM

(71) Applicant: AICHI STEEL CORPORATION, Tokai (JP)

(72) Inventors: Michiharu Yamamoto, Tokai (JP); Tomohiko Nagao, Tokai (JP); Hitoshi Aoyama, Tokai (JP)

(73) Assignee: AICHI STEEL CORPORATION, Tokai (JP)

(*) Notice: Subject to any disclaimer, the term of this patent is extended or adjusted under 35 U.S.C. 154(b) by 954 days.

This patent is subject to a terminal disclaimer.

(21) Appl. No.: 17/045,497

(22) PCT Filed: Apr. 3, 2019

(86) PCT No.: PCT/JP2019/014885
§ 371 (c)(1),
(2) Date: Oct. 6, 2020

(87) PCT Pub. No.: WO2019/198602
PCT Pub. Date: Oct. 17, 2019

(65) Prior Publication Data
US 2021/0165419 A1  Jun. 3, 2021

(30) Foreign Application Priority Data

Apr. 12, 2018 (JP) ................. 2018-077185

(51) Int. Cl.
*G05D 1/00* (2024.01)
*B62D 1/28* (2006.01)
*G01D 5/20* (2006.01)

(52) U.S. Cl.
CPC ............. *G05D 1/0259* (2013.01); *B62D 1/28* (2013.01); *G01D 5/2006* (2013.01)

(58) Field of Classification Search
CPC ......... G05D 1/0259; G05D 2201/0213; B62D 1/28; G01D 5/2006
(Continued)

(56) References Cited

U.S. PATENT DOCUMENTS 5,191,528 A   3/1993  Yardley
5,815,825 A * 9/1998  Tachibana ............... G08G 1/22
                                               318/587
(Continued)

FOREIGN PATENT DOCUMENTS

JP   56-017574 U   2/1981
JP   H03130804 A   6/1991
(Continued)

OTHER PUBLICATIONS

International Search Report for corresponding Application No. PCT/JP2019/014885, mailed Jul. 9, 2019.
(Continued)

*Primary Examiner* — Manglesh M Patel
(74) *Attorney, Agent, or Firm* — Renner, Otto, Boisselle & Sklar, LLP

(57) ABSTRACT

A marker detection device which detects a magnetic marker laid in a road by using a sensor unit in which a plurality of combinations of a magnetic sensor and a magnetic-field generation coil are arranged includes a storage part which stores characteristic information of each magnetic-field generation coil, an estimation part which estimates a magnetic differential value acting on the magnetic sensor due to a current differential value acting on the magnetic-field generation coil by referring to the characteristic information of each magnetic-field generation coil, and a calibration part
(Continued)

which calibrates each magnetic sensor so as to enhance uniformity in sensitivity, which is a ratio between an output differential value of the magnetic sensor in accordance with a change of a current by the current differential value acting on the magnetic-field generation coil and the estimated magnetic differential value.

20 Claims, 12 Drawing Sheets

(58) Field of Classification Search
USPC .................................................. 701/36, 33.1
See application file for complete search history.

(56) References Cited

U.S. PATENT DOCUMENTS

| | | | | |
|---|---|---|---|---|
| 5,951,610 | A * | 9/1999 | Nagai | G05D 1/0261 701/26 |
| 6,032,110 | A * | 2/2000 | Ishihara | G05D 1/0261 324/207.13 |
| 6,035,248 | A * | 3/2000 | Nagai | G05D 1/0261 180/169 |
| 6,215,392 | B1 * | 4/2001 | Okada | B62D 1/28 340/436 |
| 6,229,307 | B1 * | 5/2001 | Umehara | G11B 5/332 360/110 |
| 11,143,731 | B2 * | 10/2021 | Yamamoto | G05D 1/0261 |
| 2002/0022926 | A1 * | 2/2002 | Suzuki | G05D 1/0261 340/988 |
| 2002/0065600 | A1 * | 5/2002 | Oka | G08G 1/042 340/988 |
| 2002/0143442 | A1 * | 10/2002 | Uehara | G01C 21/28 318/587 |
| 2002/0143465 | A1 * | 10/2002 | Uehara | G01C 21/28 701/518 |
| 2003/0046021 | A1 * | 3/2003 | Lasky | G05D 1/0261 702/150 |
| 2003/0094944 | A1 | 5/2003 | Suzuki | |
| 2006/0061354 | A1 * | 3/2006 | Wallance | G06F 3/0346 324/207.15 |
| 2011/0037458 | A1 | 2/2011 | Zhou | |
| 2011/0160949 | A1 * | 6/2011 | Kondo | G05D 1/0261 701/23 |
| 2016/0018475 | A1 | 1/2016 | Mozs | |
| 2016/0109550 | A1 * | 4/2016 | Peczalski | G01R 15/205 324/202 |
| 2016/0132705 | A1 * | 5/2016 | Kovarik | G06K 7/10376 340/10.3 |
| 2017/0067980 | A1 * | 3/2017 | Thiagarajan | G01R 33/0035 |
| 2017/0336481 | A1 | 11/2017 | Latham et al. | |
| 2018/0106872 | A1 | 4/2018 | Kawano | |
| 2018/0283904 | A1 | 10/2018 | Yamamoto | |
| 2018/0305874 | A1 * | 10/2018 | Yamamoto | E01F 9/30 |
| 2018/0305875 | A1 * | 10/2018 | Yamamoto | G01R 33/063 |
| 2019/0011287 | A1 * | 1/2019 | Schmitt | G01R 33/0082 |
| 2019/0031076 | A1 * | 1/2019 | Yamamoto | G05D 1/021 |
| 2019/0098468 | A1 * | 3/2019 | Yamamoto | G01C 21/26 |
| 2019/0155305 | A1 * | 5/2019 | Yamamoto | G05D 1/0261 |
| 2019/0194886 | A1 * | 6/2019 | Yamamoto | G08G 1/042 |
| 2019/0196496 | A1 * | 6/2019 | Yamamoto | G05D 1/0259 |
| 2019/0212169 | A1 * | 7/2019 | Yamamoto | G01C 25/00 |
| 2020/0012294 | A1 * | 1/2020 | Yamamoto | G05D 1/0261 |
| 2020/0088902 | A1 * | 3/2020 | Yamamoto | G05D 1/0259 |
| 2020/0133299 | A1 * | 4/2020 | Yamamoto | G01C 21/165 |
| 2020/0272151 | A1 * | 8/2020 | Endo | G06Q 50/14 |
| 2020/0282834 | A1 * | 9/2020 | Endo | B60R 16/023 |
| 2020/0284586 | A1 * | 9/2020 | Yamamoto | G08G 1/163 |
| 2020/0285238 | A1 * | 9/2020 | Endo | G05D 1/12 |
| 2020/0285822 | A1 * | 9/2020 | Yamamoto | G08C 17/04 |
| 2020/0286379 | A1 * | 9/2020 | Endo | G08G 1/096838 |
| 2020/0299909 | A1 * | 9/2020 | Yamamoto | G01C 3/18 |
| 2020/0332483 | A1 * | 10/2020 | Michiharu | E01C 23/163 |
| 2020/0340825 | A1 * | 10/2020 | Yamamoto | G01C 21/3679 |
| 2021/0025959 | A1 * | 1/2021 | Yamamoto | G01R 33/0035 |
| 2021/0072309 | A1 * | 3/2021 | Guan | G01R 31/31702 |
| 2021/0089858 | A1 * | 3/2021 | Yamamoto | G06K 19/07773 |
| 2021/0149414 | A1 * | 5/2021 | Yamamoto | G08G 1/02 |
| 2021/0150905 | A1 * | 5/2021 | Yamamoto | B62D 15/025 |
| 2021/0172133 | A1 * | 6/2021 | Yamamoto | E01C 23/18 |
| 2021/0215507 | A1 * | 7/2021 | Yamamoto | G01C 21/16 |
| 2021/0230821 | A1 * | 7/2021 | Yamamoto | E01F 9/30 |
| 2021/0230822 | A1 * | 7/2021 | Yamamoto | E01F 11/00 |
| 2021/0300388 | A1 * | 9/2021 | Yamamoto | G05D 1/0261 |
| 2021/0325481 | A1 * | 10/2021 | Motz | G01R 33/0035 |
| 2021/0340715 | A1 * | 11/2021 | Yamamoto | G08G 1/167 |
| 2021/0390588 | A1 * | 12/2021 | Yamamoto | G06Q 30/0251 |
| 2022/0068129 | A1 * | 3/2022 | Yamamoto | G05D 1/0259 |
| 2022/0075385 | A1 * | 3/2022 | Yamamoto | G05D 1/027 |
| 2022/0120710 | A1 * | 4/2022 | Yamamoto | G06T 7/13 |
| 2022/0316159 | A1 * | 10/2022 | Tasaka | E01F 11/00 |
| 2022/0396922 | A1 * | 12/2022 | Yamamoto | G01S 17/06 |
| 2022/0412024 | A1 * | 12/2022 | Yamamoto | B60W 60/001 |
| 2023/0027357 | A1 * | 1/2023 | Satou | B60W 60/00186 |
| 2023/0030682 | A1 * | 2/2023 | Roy | G01R 19/0015 |
| 2023/0033183 | A1 * | 2/2023 | Yamamoto | B32B 7/12 |
| 2023/0194633 | A1 * | 6/2023 | Ausserlechner | G01R 33/0017 324/202 |
| 2023/0250598 | A1 * | 8/2023 | Yamamoto | G06K 7/087 701/23 |

FOREIGN PATENT DOCUMENTS

| | | |
|---|---|---|
| JP | 11-52036 A | 2/1999 |
| JP | 2000-227998 A | 8/2000 |
| JP | 2003-202365 A | 7/2003 |
| JP | 2006-275959 A | 10/2006 |
| JP | 2015-62031 A | 4/2015 |
| JP | 2016-17830 A | 2/2016 |
| JP | 2016-510116 A | 4/2016 |
| JP | 2016-194531 A | 11/2016 |
| JP | 2017-83189 A | 5/2017 |
| WO | 2005/073744 A1 | 8/2005 |
| WO | 2016/158096 A1 | 10/2016 |

OTHER PUBLICATIONS

Extended European Search Report for corresponding Application No. 19784464.0 dated Dec. 8, 2021.

* cited by examiner

[FIG.1]
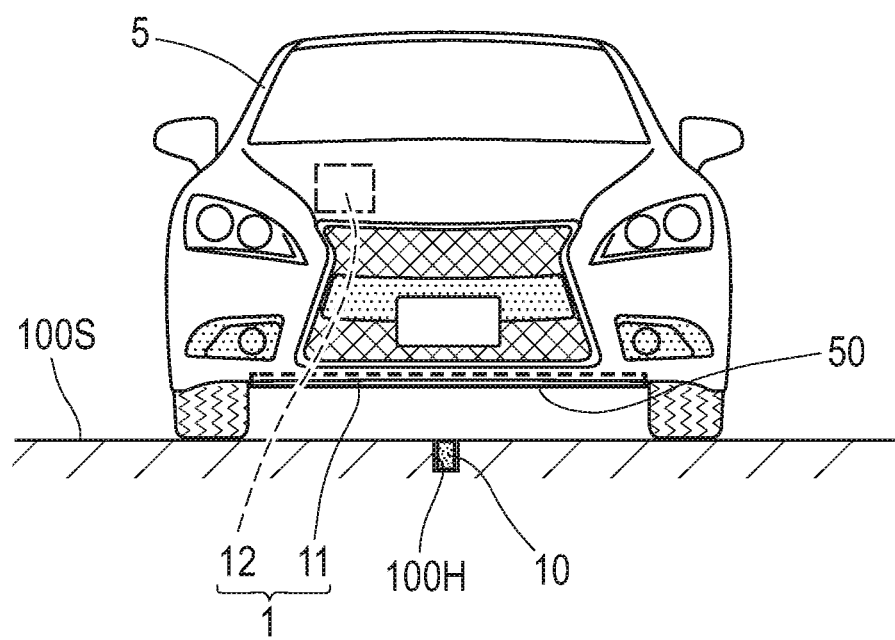

[FIG.2]
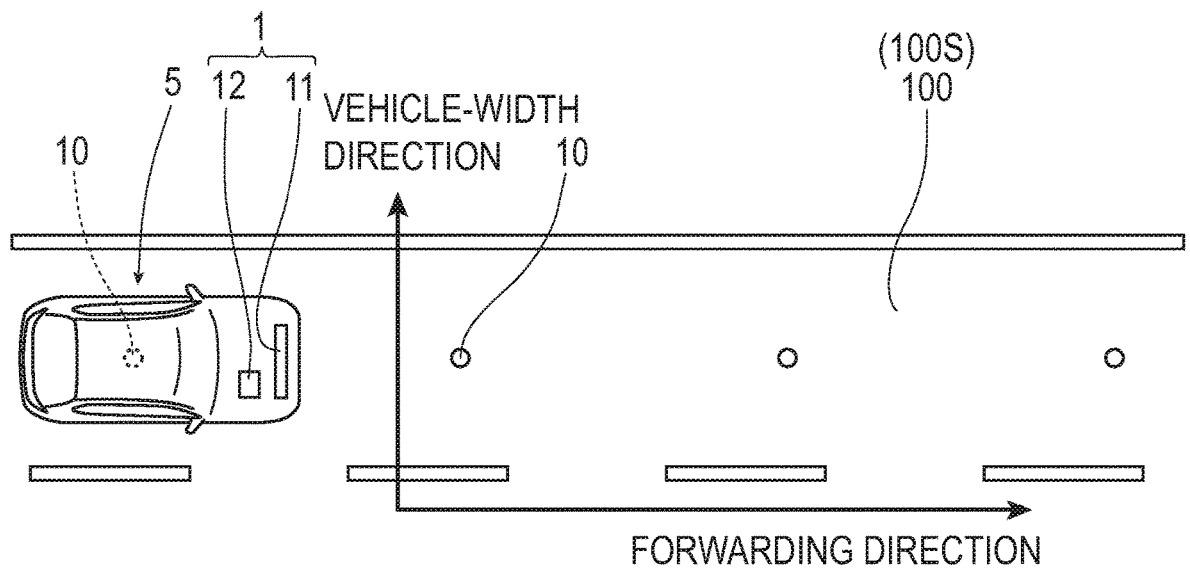

[FIG.3]
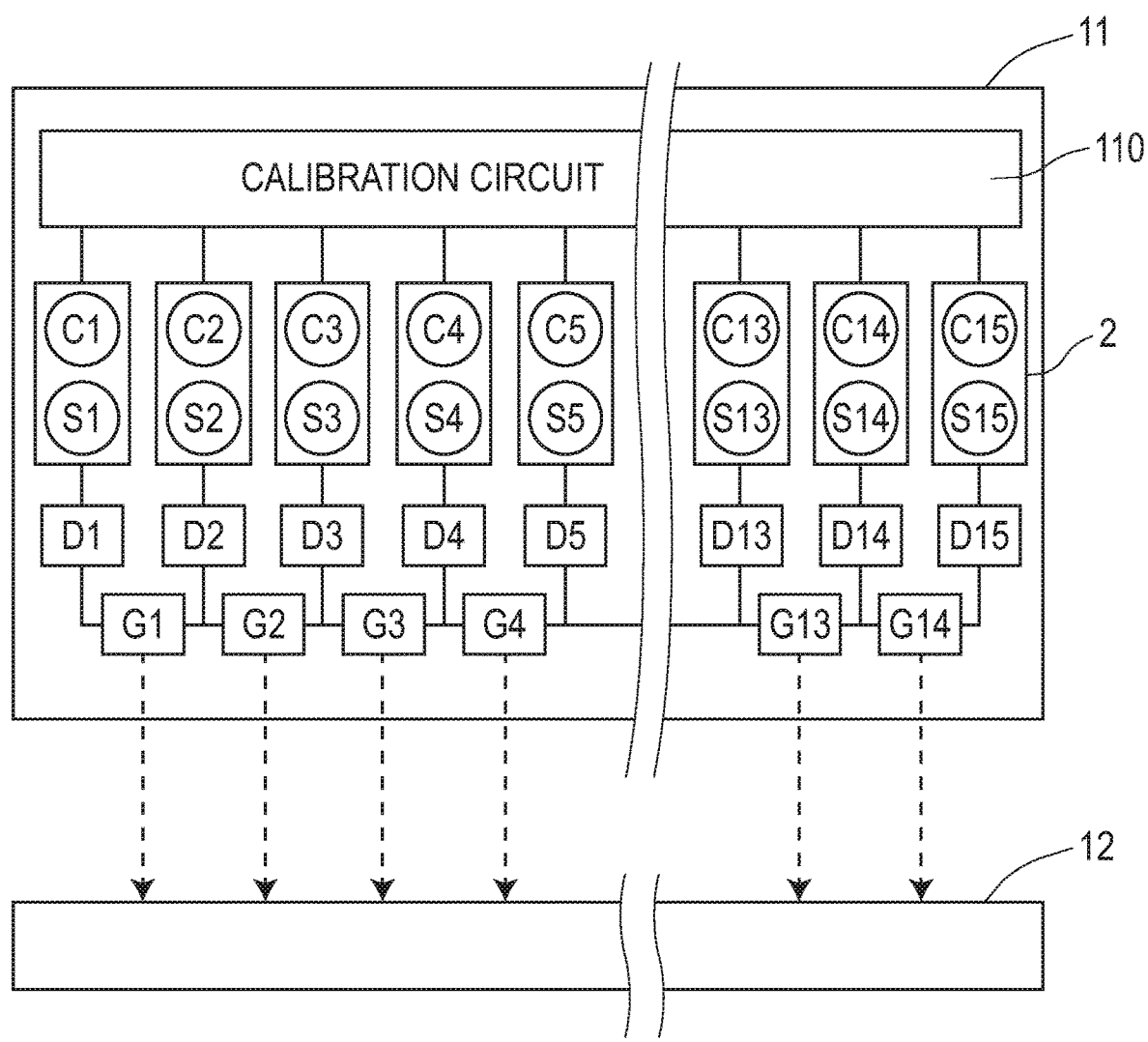

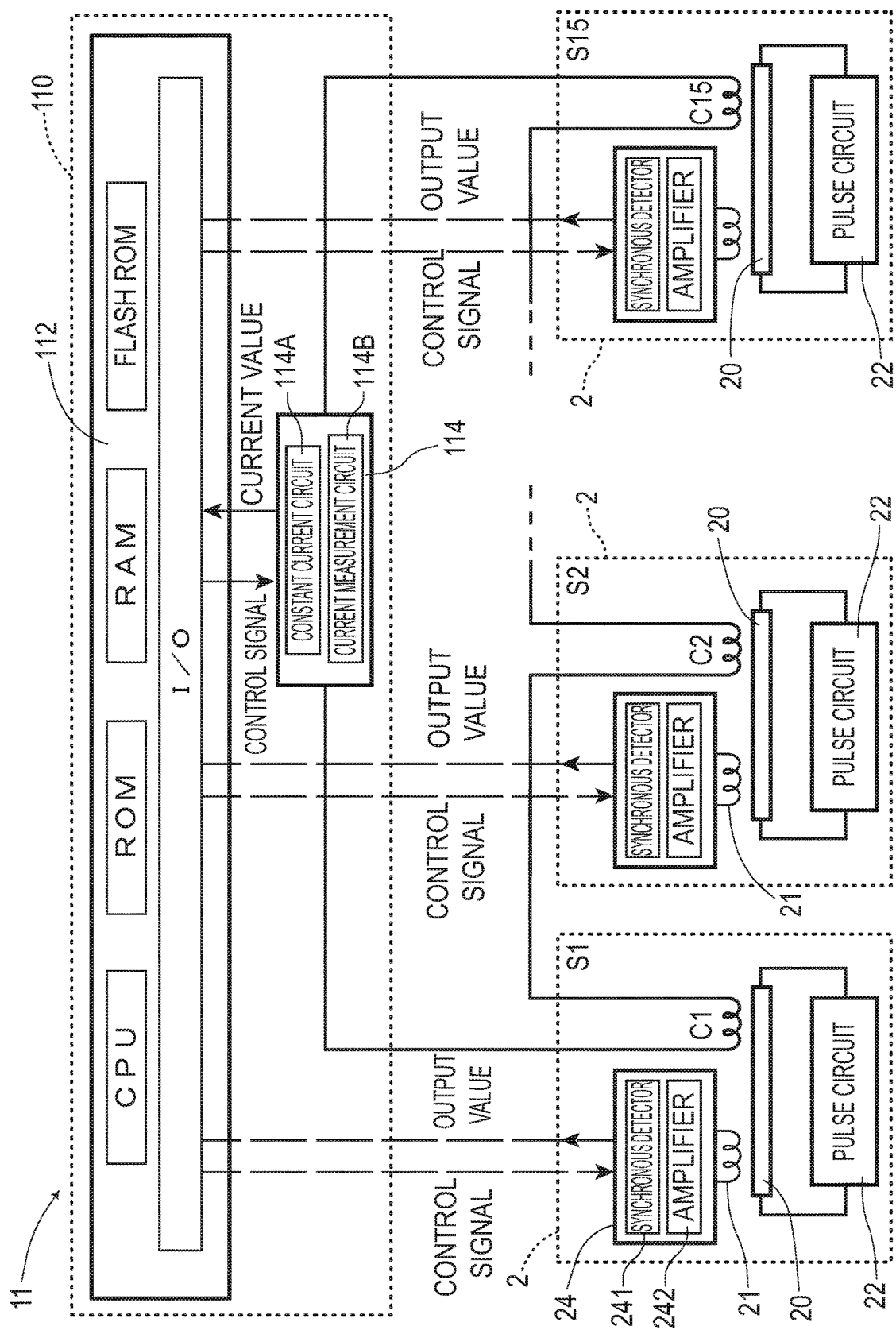
[FIG.4]

[FIG.5]
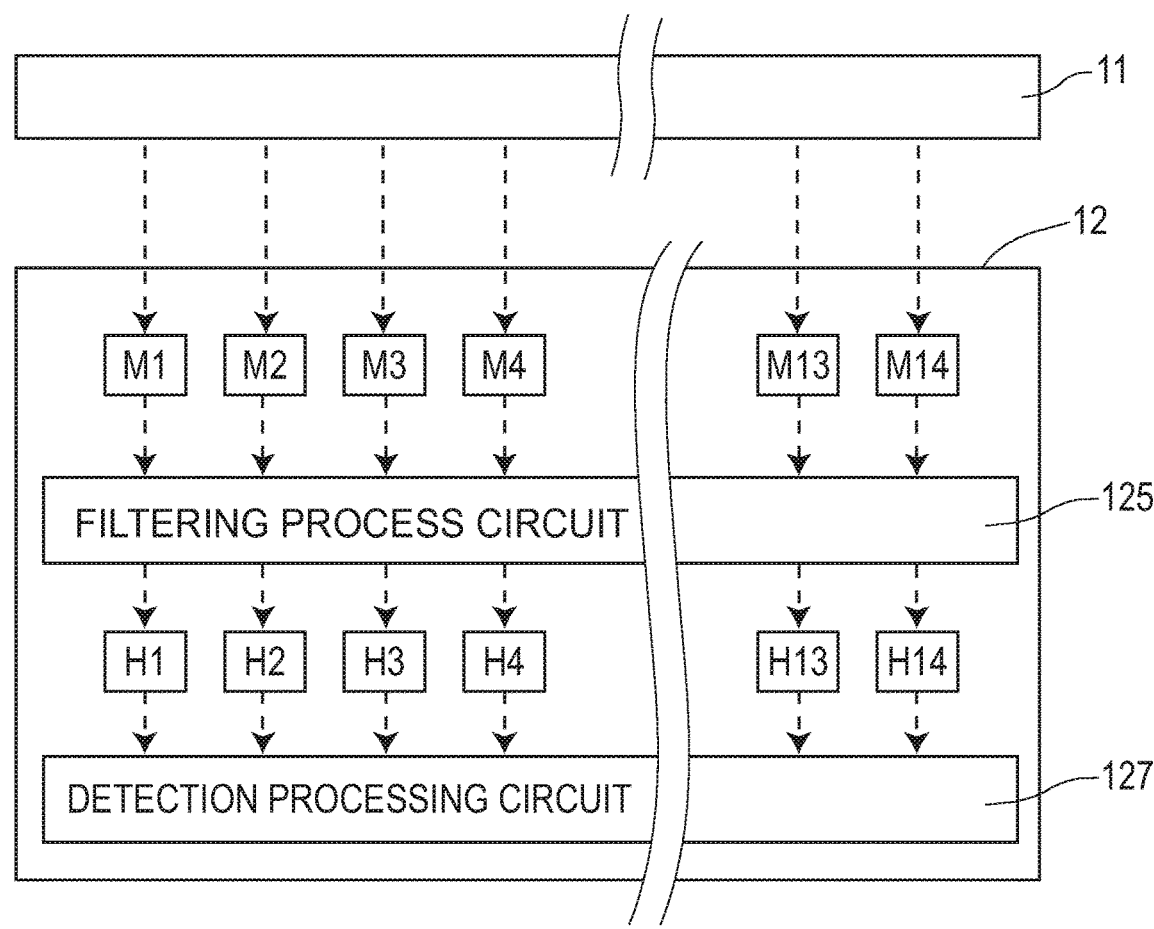

[FIG.6]
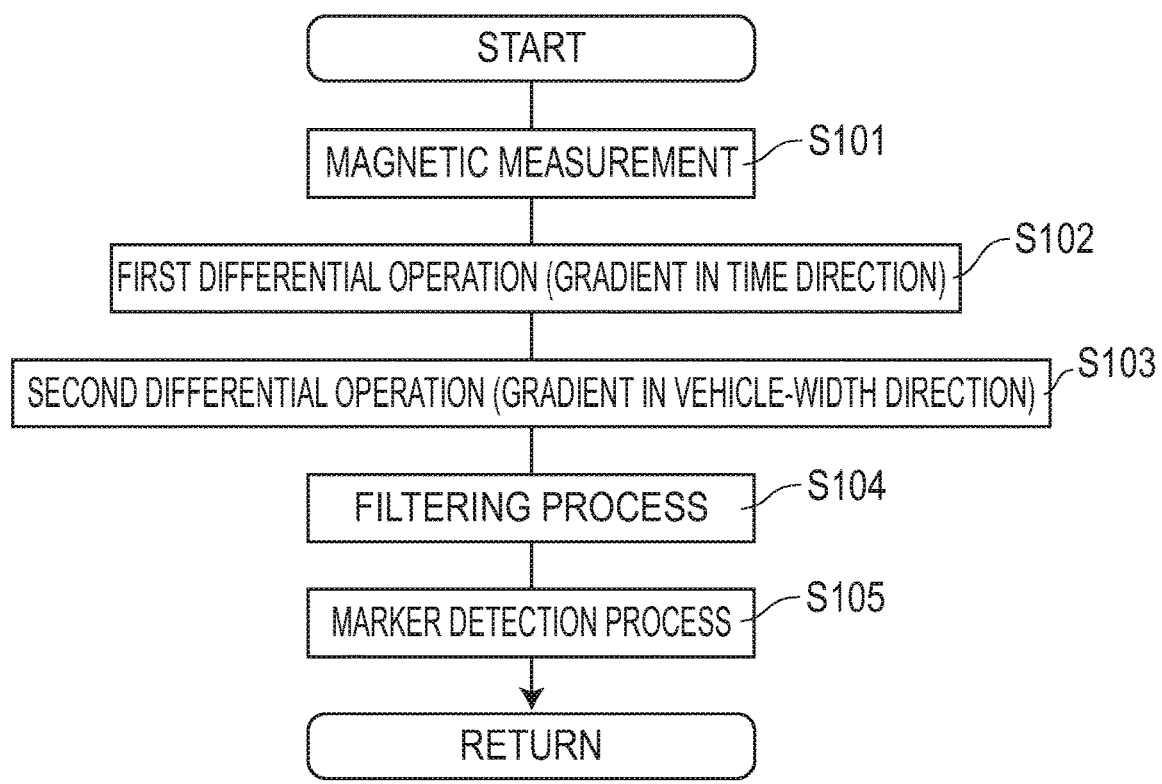

[FIG.7]
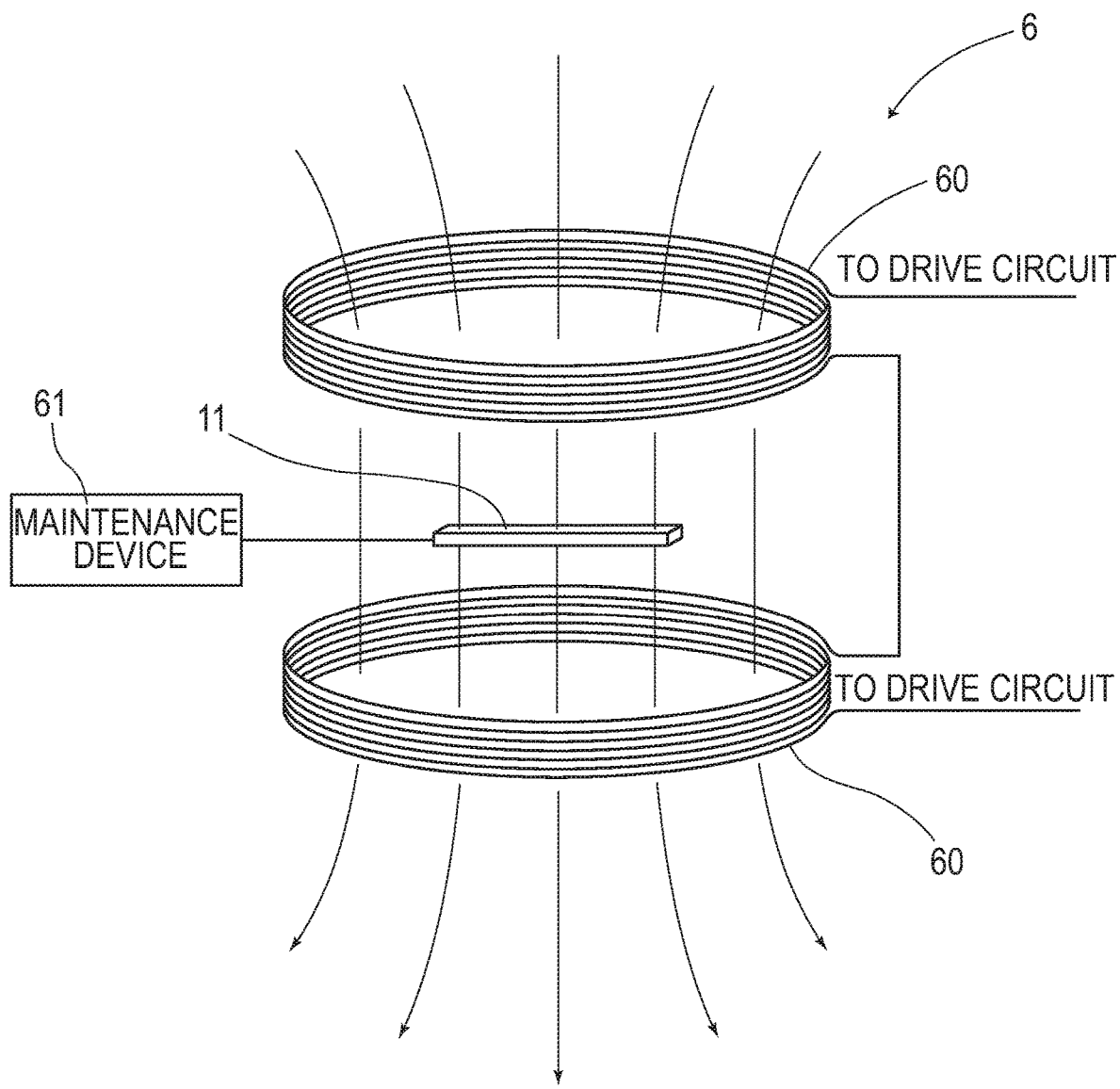

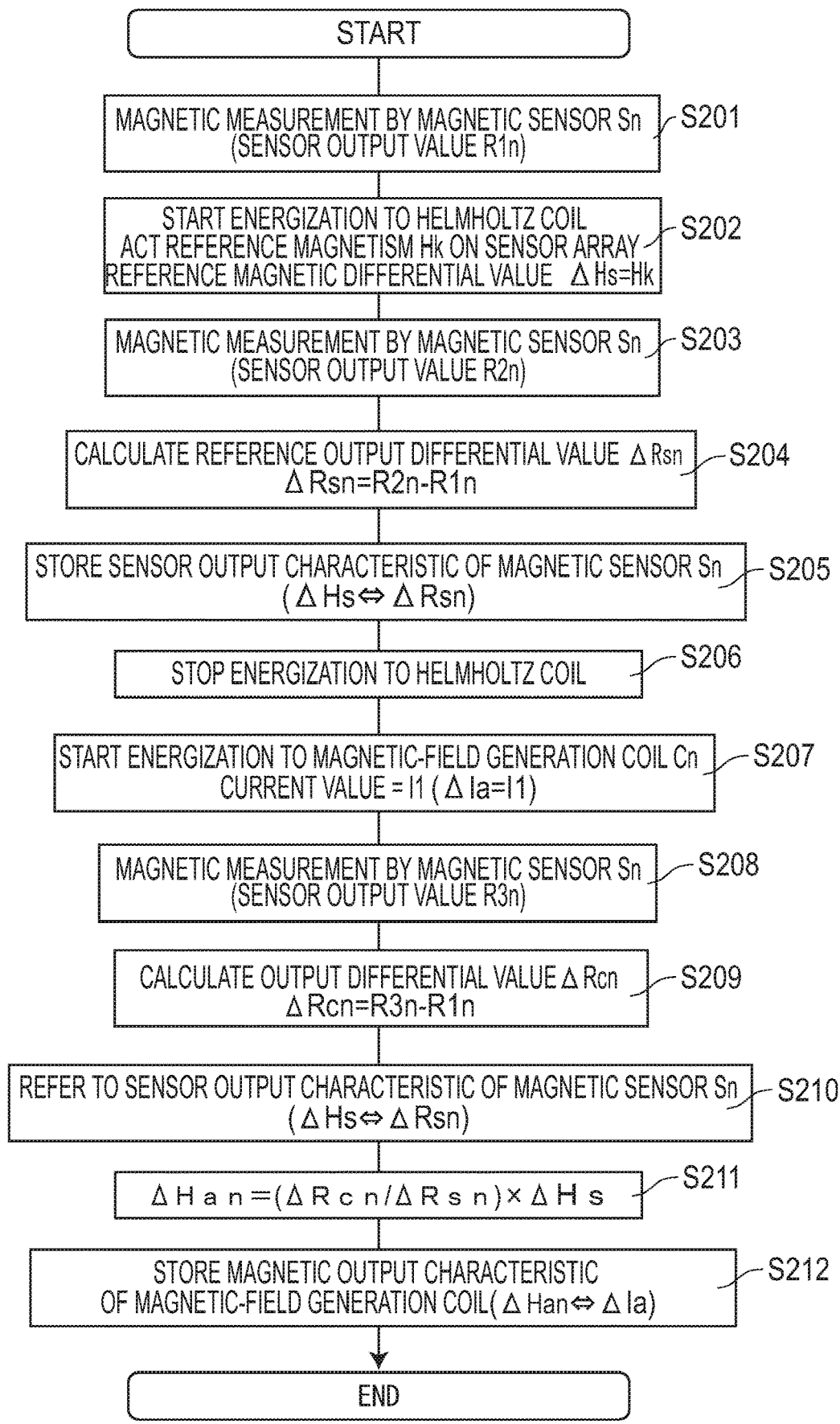

[FIG.9]
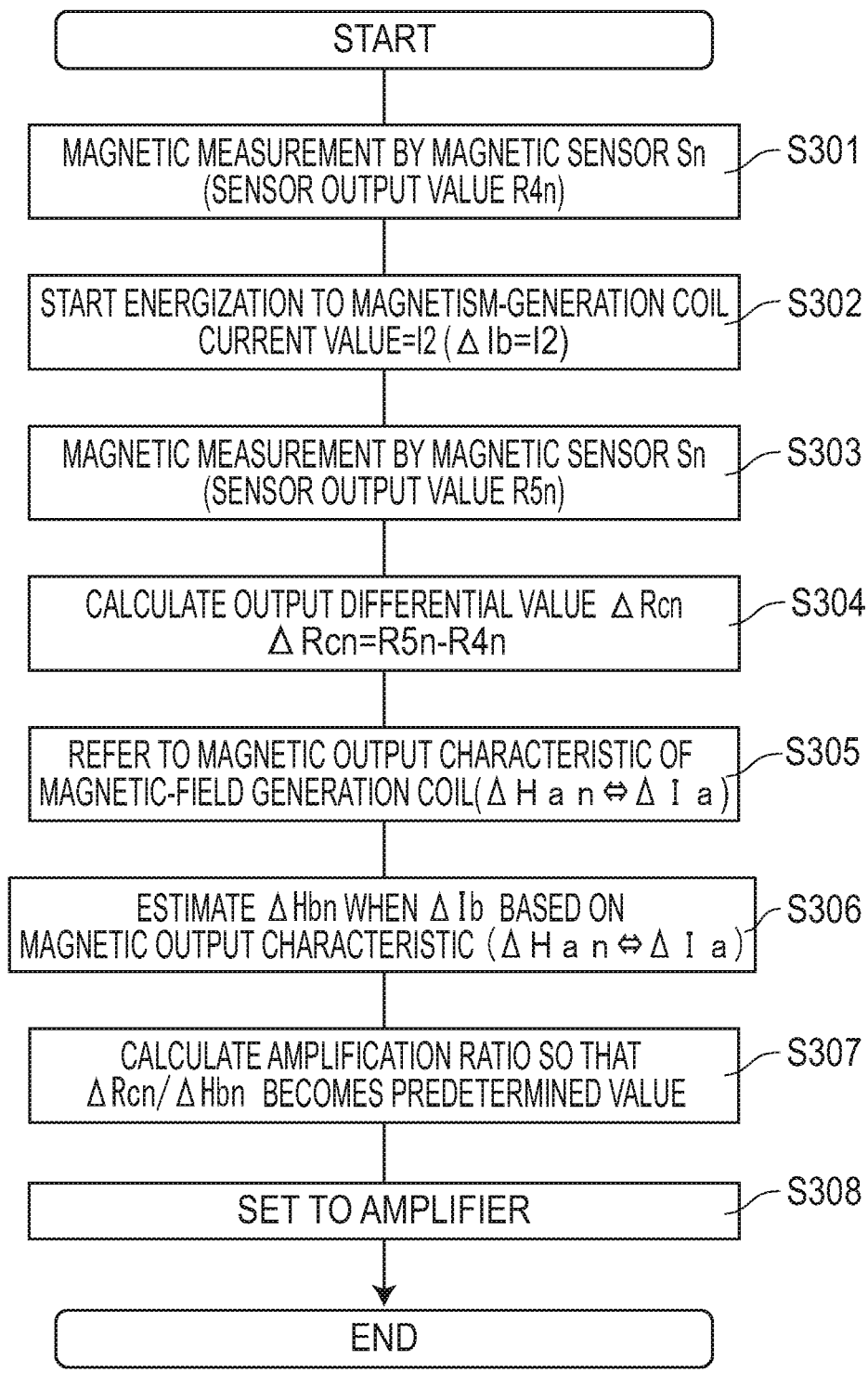

[FIG.10]
(a)
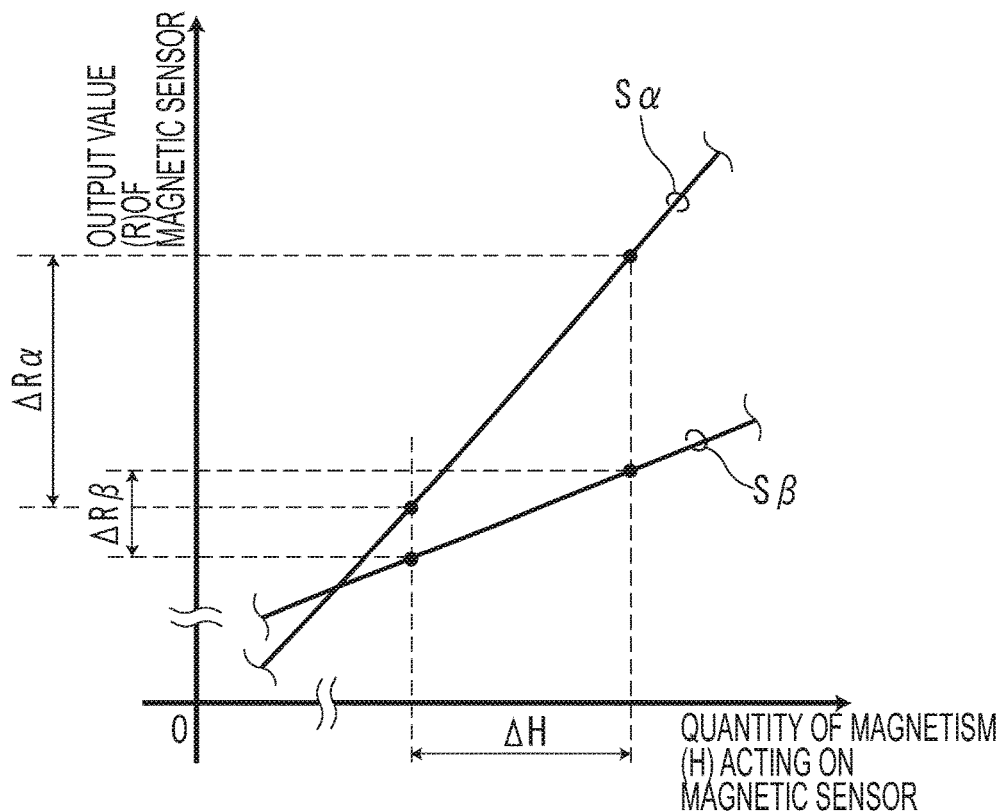
(b)
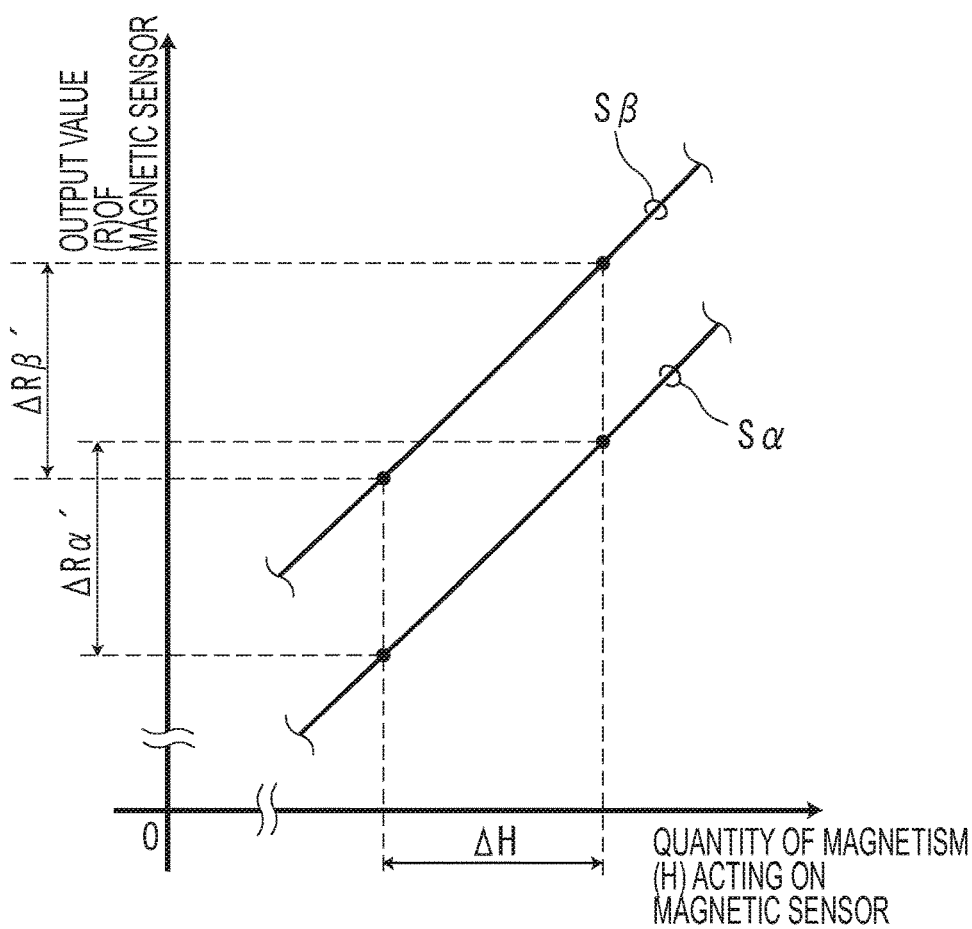

[FIG.11]
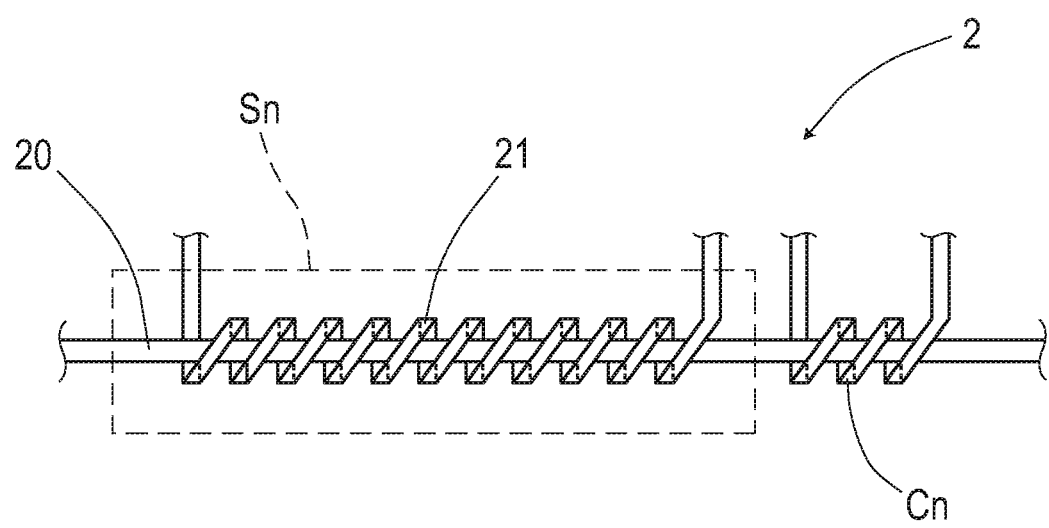

[FIG.12]
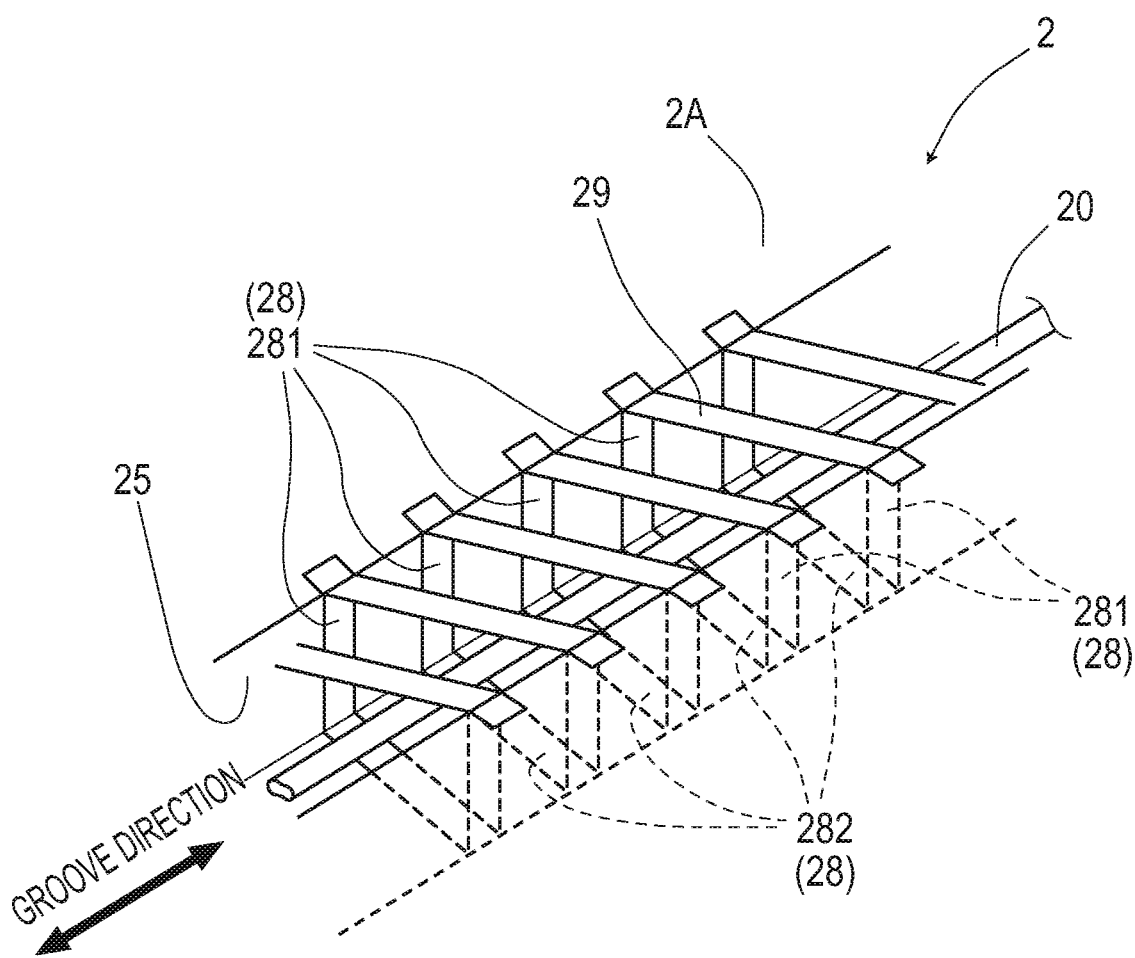

MARKER DETECTION SYSTEM AND METHOD OF OPERATING MARKER DETECTION SYSTEM

TECHNICAL FIELD

The present invention relates to a marker detection system for detecting a magnetic marker laid in a road and a method of operating the marker detection system.

BACKGROUND ART

Conventionally, there has been a suggestion of a magnetic marker detection method for detecting a magnetic marker laid in a road by using a plurality of magnetic sensors attached to a vehicle (for example, refer to Patent Literature 1 described below). In this magnetic marker detection method, a difference between output values of two or more magnetic sensors among the plurality of magnetic sensors is obtained to suppress influences of disturbance magnetism, thereby enhancing accuracy of detecting the magnetic marker.

CITATION LIST

Patent Literature

Patent Literature 1: Japanese Unexamined Patent Application Publication No. 2017-083189

SUMMARY OF INVENTION

Technical Problem

However, the above-described conventional magnetic marker detection method has the following problem. That is, if each magnetic sensor has an individual difference in an output characteristic, a variation error of the output values due to the individual difference is amplified by differential operation to become a large error. Thus, magnetic sensors are required to be regularly calibrated in a use period of the vehicle, which may increase burdens on a vehicle user side.

The present invention was made in view of the above-described conventional problem, and is to provide a system and an operating method capable of detecting a magnetic marker with high accuracy by using a plurality of magnetic sensors.

Solution to Problem

One mode of the present invention resides in a marker detection system which detects a magnetic marker laid in a road by using a sensor unit in which a plurality of magnetic sensors which measure strength of magnetism are arranged, each of the magnetic sensors of the sensor unit being individually provided with a magnetic-field generation part which generates a magnetic field in accordance with a current passed, the system including:

a storage part which stores characteristic information of each of a plurality of the magnetic-field generation parts indicating a magnetic output characteristic, which is a relation between the current passed to the magnetic-field generation part and magnetism with which the magnetic-field generation part acts on a corresponding magnetic sensor of the magnetic sensors;

an estimation part which estimates a magnetic differential value A, which is an amount of change of the magnetism acting on the corresponding magnetic sensor due to a current differential value A, which is an amount of change of the current passed to the magnetic-field generation part, by referring to the characteristic information of each of the magnetic-field generation parts stored by the storage part; and a calibration part which calibrates the each of the magnetic sensors so as to enhance uniformity in sensitivity, which is a ratio between an output differential value A, which is an amount of change of a sensor output outputted by the corresponding magnetic sensor in accordance with a change of the current by the current differential value A acting on the magnetic-field generation part, and the magnetic differential value A estimated by the estimation part for the current differential value A.

One mode of the present invention resides in a method of operating a marker detection system which detects a magnetic marker laid in a road by using a sensor unit in which a plurality of magnetic sensors which measure strength of magnetism are arranged, each of the magnetic sensors of the sensor unit being individually provided with a magnetic-field generation part which generates a magnetic field in accordance with a current passed, and the marker detection system including a storage part which stores characteristic information of each of a plurality of the magnetic-field generation parts indicating a magnetic output characteristic, which is a relation between the current passed to the magnetic-field generation part and magnetism with which the magnetic-field generation part acts on a corresponding magnetic sensor of the magnetic sensors, the method including:
  a magnetic estimation step of estimating a magnetic differential value A, which is an amount of change of the magnetism acting on the corresponding magnetic sensor due to a current differential value A, which is an amount of change of the current passed to the magnetic-field generation part, based on the characteristic information of each of the magnetic-field generation parts stored by the storage part; and
  a calibration step of calibrating the each of the magnetic sensors so as to enhance uniformity in sensitivity, which is a ratio between an output differential value A, which is an amount of change of a sensor output outputted by the corresponding magnetic sensor in accordance with a change of the current by the current differential value A acting on the magnetic-field generation part, and the magnetic differential value A estimated at the magnetic estimation step for the current differential value A.

Advantageous Effects of Invention

In the present invention, based on the characteristic information of the magnetic-field generation part, the magnetic differential value acting on the magnetic sensor by the magnetic-field generation part can be estimated. And, in the present invention, by using a result of estimation of the magnetic differential value acting on the magnetic sensor, the magnetic sensor can be calibrated.

As described above, according to the present invention, each magnetic sensor can be calibrated by using the magnetic-field generation part individually provided to each magnetic sensor, and highly-accurate detection of the magnetic marker laid in the road can be achieved.

BRIEF DESCRIPTION OF DRAWINGS

FIG. 1 is a front view of a vehicle with a sensor array attached thereto in a first embodiment.

FIG. 2 is a bird's eye view depicting a lane where magnetic markers are laid in the first embodiment.

FIG. 3 is a block diagram depicting a configuration of the sensor array in the first embodiment.

FIG. 4 is a block diagram depicting a configuration of magnetic sensors and a calibration circuit in the first embodiment.

FIG. 5 is a block diagram depicting a configuration of a detection unit in the first embodiment.

FIG. 6 is a flow diagram depicting a flow of a process for detecting a magnetic marker in the first embodiment.

FIG. 7 is a descriptive diagram of a device for performing a process under a maintenance mode in the first embodiment.

FIG. 8 is a flow diagram depicting a flow of the process under the maintenance mode in the first embodiment.

FIG. 9 is a flow diagram depicting a flow of a process under a normal mode in the first embodiment.

FIG. 10 depicts descriptive diagrams of a process of calibrating the magnetic sensor in the first embodiment ((a) sensor output characteristic of the magnetic sensor before calibration and (b) sensor output characteristic of the magnetic sensor after calibration).

FIG. 11 is a descriptive diagram depicting a pickup coil and a magnetic-field generation coil arranged in parallel along an amorphous wire in a second embodiment.

FIG. 12 is a referential diagram for describing a coil formation method in the second embodiment.

DESCRIPTION OF EMBODIMENTS

In the present invention, a current differential value acting on a magnetic-field generation part indicates an amount of change of current to be passed. For example, when a state of non-energization to the magnetic-field generation part is switched to an energization state, a value of the current to be passed is switched from a zero state to a current value under the energization state, and thus the current differential value becomes the current value itself under the energization state.

EMBODIMENTS

Modes for implementing the present invention are specifically described by using following embodiments.

First Embodiment

The present embodiment is an example regarding a marker detection system and its operating method suitable for detecting a magnetism generation source. Details of this are described by using FIG. 1 to FIG. 10.

Marker detection device 1 forming one example of the marker detection system is a vehicle onboard device to be incorporated in vehicle 5 to detect magnetic markers 10 laid in a road, as in FIG. 1 and FIG. 2. Magnetic markers 10 are laid, for example, in road surface 100S so as to be along a center of lane 100 where vehicle 5 travels. For example, magnetic marker 10 forming a columnar shape having a diameter of 20 mm and a height of 28 mm is accommodated and buried in accommodation hole 100H bored in road surface 100S.

(1) Configuration of Marker Detection Device

As in FIG. 1 and FIG. 2, marker detection device 1 is a device with sensor array (one example of a sensor unit) 11 including a plurality of magnetic sensors Sn and detection unit (one example of a detection part) 12 having incorporated therein a CPU (central processing unit) not depicted and so forth combined together. In particular, sensor array 11 of the present embodiment includes a function of calibrating magnetic sensors Sn.

Sensor array 11 is attached to vehicle-body floor 50 corresponding to a bottom surface of vehicle 5. In a case of vehicle 5 of the present embodiment, an attachment height with reference to road surface 100S is approximately 200 mm.

Detection unit 12 is a unit which subjects a sensor signal outputted from sensor array 11 to a process and detects magnetic marker 10. A result of detection by detection unit 12 is inputted to, for example, an ECU (Electronic Control Unit) not depicted or the like on a vehicle 5 side, and used in various controls such as automatic steering control and lane departure warning for vehicle 5 to travel while keeping the lane.

(1.1) Configuration of Sensor Array

Sensor array 11 is a sensor unit with fifteen sensor chips 2 arranged on a straight line as in FIG. 3. Sensor array 11 is configured to include, in addition to fifteen sensor chips 2, differential circuits Dn (n is a natural number of 1 to 15), differential circuits Gm (m is a natural number of 1 to 14), calibration circuit 110, and so forth.

Sensor chip 2 is an electronic component with one magnetic sensor Sn and one magnetic-field generation coil (one example of a magnetic-field generation part) Cn incorporated therein and further with an electronic circuit incorporated therein to be made into one chip. As the electronic circuit, pulse circuit 22 and signal processing circuit 24, which will be described further below, and so forth are incorporated. In sensor array 11, fifteen sensor chips 2 are arranged on the straight line. With this, in sensor array 11, a mode is achieved in which fifteen magnetic sensors Sn are arrayed on the straight line. Also, by adopting sensor chips 2 with magnetic-field generation coils Cn incorporated therein, a mode is achieved in which magnetic-field generation coil Cn is individually provided to each magnetic sensor Sn.

Sensor array 11 is attached so that magnetic sensor S1 is positioned on a left side of vehicle 5 (on a passenger's side of a right-hand drive vehicle) and the other sensors are aligned in a numerical sequence toward right side along a vehicle-width direction. A space between magnetic sensors Sn in sensor array 11 is set at 70 mm so that two adjacent magnetic sensors can simultaneously detect magnetism of magnetic marker 10. With this space being set, it is possible to calculate a differential value indicating a gradient in the vehicle-width direction by differential operation or the like on output values from two adjacent magnetic sensors or operation values based on the output values.

Differential circuit Dn is a circuit which calculates a differential operation value indicating a gradient in a time direction based on output values from each magnetic sensor Sn as in FIG. 3. Differential circuits Dn each store an output value at a time of a temporally-preceding previous magnetic measurement (sampling). Differential circuit Dn calculates a time differential value indicating the gradient in the time direction by subtracting a previous output value from a temporally-subsequent output value this time.

Differential circuit Gm is a circuit which calculates a differential value in the vehicle-width direction, which is a differential operation value indicating the gradient in the vehicle-width direction, by performing, as for time differential values of two differential circuits Dn corresponding to two adjacent magnetic sensors Sn, subtraction one time differential value from the other time differential value.

Sensor array 11 outputs differential operation values (differential values in the vehicle-width direction) by fourteen differential circuits Gm as sensor signals. Sensor array 11 includes output ports of fourteen channels so as to be able to simultaneously output the differential operation values of fourteen differential circuits Gm. Note that sensor array 11 of the present embodiment performs magnetic measurement in a cycle of 3 kHz so as to support high-speed traveling of vehicle 5 and inputs sensor signals to detection unit 12 every time magnetic measurement is performed.

In sensor chip 2 included in sensor array 11, as in FIG. 4, magnetic sensor Sn is configured by using an MI (Magneto-Impedance) element. The MI element is an element including amorphous wire (magnetic wire) 20 made of a CoFeSiB-based alloy and having nearly zero magnetostriction and pickup coil (coil) 21 wound around this amorphous wire 20. Magnetic sensor Sn is a high-sensitivity sensor with a measurement range of magnetic flux density of ±0.6 millitesla and a magnetic flux resolution of ±0.02 microtesla in the measurement range. This high sensitivity is achieved by the MI effect, in which an impedance of amorphous wire 20 sensitively changes in accordance with an external magnetic field.

The MI element measures voltage occurring in pickup coil 21 when a pulse current is passed through amorphous wire 20, thereby detecting magnetism acting on amorphous wire 20. This MI element has detection sensitivity in an axial direction of amorphous wire 20, which is a magnetically sensitive body. Note that sensor array 11 is assembled to vehicle 5 so that amorphous wires 20 of respective magnetic sensors Sn are along the vehicle-width direction.

Pulse circuit 22 (FIG. 4) incorporated in sensor chip 2 is a circuit which generates a pulse signal as a source of the pulse current to be passed through amorphous wire 20.

Signal processing circuit 24 (FIG. 4) is a circuit which takes out induced voltage of pickup coil 21 by using synchronous detector 241 which opens and closes in conjunction with the pulse signal and amplifies that induced voltage by amplifier 242. Signal processing circuit 24 takes the induced voltage after amplification as an output value of magnetic sensor Sn, and inputs that value to differential circuit Dn (FIG. 3). Note that the output value of magnetic sensor Sn is inputted also to calibration circuit 110. Amplifier 242 of signal processing circuit 24 can adjust an amplification factor of the induced voltage with control by calibration circuit 110.

Magnetic-field generation coils Cn of respective sensor chips 2 are coils each formed of a wound electric wire, and are connected so as to be electrically in series to one another. Magnetic-field generation coil Cn generates a magnetic field in accordance with energization by calibration circuit 110 to cause magnetism to act on magnetic sensor Sn. The calibration function of magnetic sensors Sn included in sensor array 11 is achieved by using these magnetic-field generation coils Cn. Magnetic-field generation coils Cn, each of which is the coil formed of the wound electric wire, have characteristics of high linearity in a quantity of magnetism with respect to a magnitude of energizing current, and thus are suitable for calibration of magnetic sensors Sn.

Each magnetic-field generation coil Cn has common design specifications and also has common embedding specifications which define a relative positional relation with magnetic sensor Sn. Also, through respective magnetic-field generation coils Cn connected in series, current supplied from calibration circuit 110 is equally passed. Therefore, in view of design, each magnetic-field generation coil Cn can equally act on its corresponding magnetic sensor Sn with magnetism. However, variation in a magnetic output characteristic of each magnetic-field generation coil Cn is unavoidable and, moreover, variation in positional relation with magnetic sensor Sn is also unavoidable. Thus, a variation error occurs in the quantity of magnetism with which each magnetic-field generation coil Cn acts on its corresponding magnetic sensor Sn.

Calibration circuit 110 (FIG. 4) is configured to include coil driving part 114 which performs energization to magnetic-field generation coils Cn and calibration part 112 which performs a calibration process on magnetic sensors Sn and other processes. Calibration part 112 is configured to include a CPU; a ROM (read only memory), a RAM (random access memory), and a flash ROM; an I/O; and so forth. This calibration part 112 includes functions as a storage part which stores characteristic information (magnetic output characteristics) of magnetic-field generation coils Cn required for calibrating magnetic sensors Sn, and as an estimation part which estimates a magnetic differential value acting on magnetic sensor Sn due to a current differential value acting on magnetic-field generation coil Cn, and so forth. Here, the current differential value indicates an amount of change of current to be passed to magnetic-field generation coil Cn. The magnetic differential value indicates an amount of change of magnetism acting on magnetic sensor Sn.

Coil driving part 114 is configured to include constant current circuit 114A which supplies current to magnetic-field generation coils Cn and current measurement circuit 114B which measures a current value of supply current. Constant current circuit 114A supplies current to magnetic-field generation coils Cn in accordance with the control by calibration circuit 110. Current measurement circuit 114B inputs measured current values of magnetic-field generation coils Cn to calibration part 112.

Calibration part 112 can perform operating modes of at least two types, with the CPU processing a program read from the ROM. The operating modes include a normal mode to be performed during a use period of vehicle 5 and a maintenance mode at a time of factory shipping or maintenance work. Switching between the normal mode and the maintenance mode is performed with control by, for example, externally-connected maintenance device 61 (refer to FIG. 7).

The normal mode is an operating mode for calibrating each magnetic sensor Sn in the use period of vehicle 5. The maintenance mode is an operating mode for identifying a magnetic output characteristic (characteristic information) of each magnetic-field generation coil Cn by using reference magnetism of Helmholtz coil 60 (refer to FIG. 7). The characteristic information (will be described further below) of each magnetic-field generation coil Cn identified in this maintenance mode is stored by a storage part such as the flash ROM configuring calibration circuit 110 (calibration part 112) and used in calibration of magnetic sensors Sn. Note that details of each operation mode will be described further below with reference to flow diagrams of FIG. 8 and FIG. 9 and so forth.

Here, Helmholtz coil 60 of FIG. 7 is a coil system which includes two circular coils in common specifications arranged as being separated from each other on a same axis, with a space between two circular coils being equal to a radius of the coils. In this Helmholtz coil 60, with equal currents in a same orientation being passed through the two circular coils, a magnetic field with high uniformity can be generated. Magnetism generated by Helmholtz coil 60 can be used as reference magnetism, which is a reference quantity of magnetism. Note that a Maxwell coil is also favorably used, in which a large-diameter coil is concentrically arranged on an outer peripheral side of Helmholtz coil 60 to further enhance uniformity of the magnetic field.

(1.2) Configuration of Detection Unit

Detection unit 12 is a unit, as in FIG. 5, which includes an electronic substrate (omitted in the drawings) with a CPU which performs various calculations, memory elements such as a ROM and a RAM, and so forth implemented thereon. This detection unit 12 supports collective intake of sensor signals of fourteen channels outputted by sensor array 11.

Detection unit 12 includes filtering process circuit 125 which subjects time-series data to a filtering process based on sensor signals outputted by sensor array 11 and detection processing circuit 127 which performs a marker detection process. Also, this detection unit 12 is provided with data areas M1 to M14 (denoted as Mm as appropriate) storing sensor signals outputted by sensor array 11 and data areas H1 to H14 (denoted as Hm as appropriate) storing filtered output values of filtering process circuit 125.

Data areas Mm are storage areas for sequentially storing data indicated by sensor signals of fourteen channels outputted by sensor array 11 in the cycle of 3 kHz as described above and storing that data as time-series data for each channel.

Filtering process circuit 125 is a circuit which subjects time-series data of fourteen channels stored in data areas Mm to the filtering process for each channel. A filter applied to this filtering process is a high-pass filter which suppresses or cuts off low-frequency components and lets high-frequency components pass.

(2) Operation of Marker Detection Device

As the operation of marker detection device 1, (2.1) operation of detecting magnetic marker 10 is generally described, and then details about (2.2) operation of calibrating magnetic sensors Sn are described. Note that, as described above, (2.2) operation of calibrating magnetic sensors Sn includes (2.2.1) process under the maintenance mode and (2.2.2) process under the normal mode.

(2.1) Operation of Detecting Magnetic Marker

In detecting magnetic marker 10, detection unit 12 controls sensor array 11 so that magnetic measurement is performed by each magnetic sensor Sn in, for example, the cycle of 3 kHz, as in FIG. 6 (S101). Output value Rn of each magnetic sensor Sn is first inputted to differential circuit Dn (FIG. 3), and the time differential value indicating the gradient of output value Rn of magnetic sensor Sn in the time direction is obtained (S102).

The time differential value of each magnetic sensor Sn is inputted to differential circuit Gm (FIG. 3) which calculates a difference in the vehicle-width direction. For example, time differential values of differential circuits D1 and D2 are inputted to differential circuit G1, where a differential operation of subtracting the time differential value of D1 from the time differential value of D2 is performed (S103). A differential value in the vehicle-width direction, which is a differential operation value in the vehicle-width direction by differential circuit Gm, is a value of a difference between time differential values regarding two magnetic sensors Sn adjacent to each other in sensor array 11, and indicates a gradient of the time differential value in the vehicle-width direction.

Here, the differential operations at S102 and S103 in FIG. 6 by differential circuits Dn and differential circuits Gm are very effective in removing common magnetic noise uniformly acting on each magnetic sensor Sn. It is highly probable that the common magnetic noise occurs not only from geomagnetism but also from a large-size magnetism generation source such as, for example, an iron bridge or another vehicle. In the case of a large magnetism generation source, a magnetic-field loop from the N pole to the S pole is very large, and thus the magnetic field becomes close to be uniform at an intermediate position between both poles, exhibiting a mode of the common magnetic noise in which the magnetism acting on each magnetic sensor Sn is close to be uniform. According to the differential operations at S102 and S103 described above, this common magnetic noise can be efficiently removed.

Sensor array 11 collectively outputs sensor signals of fourteen channels formed of differential values in the vehicle-width direction by differential circuits Gm. Detection unit 12 stores time-series data for each channel based on these sensor signals in data areas Mm (FIG. 5). When acquiring new sensor signals, detection unit 12 deletes the most obsolete data among data stored in data area Mm and progressively sends each piece of data in data area Mm to provide a free area, and stores data indicated by a newly-acquired sensor signal in that free area. This generates, in data areas Mm, time-series data of differential values in the vehicle-width direction by differential circuits Gm over a previous predetermined period.

Detection unit 12 inputs the time-series data for each channel stored in data area Mm to filtering process circuit 125. Filtering process circuit 125 performs the filtering process for cutting off low-frequency components and letting high-frequency components pass through (high-pass filtering process) (in FIG. 6, S104), and stores filtered output values in data areas Hm. Then, detection unit 12 performs the marker detection process for detecting magnetic marker 10 by using the filtered output values stored in data areas Hm (S105).

Detection unit 12 which performs this marker detection process extracts filtered output values derived from magnetic marker 10 by, for example, threshold process or the like regarding the filtered output values stored in data areas Hm, thereby detecting magnetic marker 10. Furthermore, a relative position of magnetic marker 10 in the vehicle-width direction is identified based on, for example, which data area among data areas H1 to H14 a filtered output value exceeding a threshold belongs to, or the like.

For example, in the case of the large magnetism generation source such as a bridge or a tunnel, as described above, a certain effect can be achieved in which the differential operations at S102 and S103 of FIG. 6 can suppress external magnetism such as uniformly-acting common magnetic noise or the like. However, even in the large magnetism generation source, a magnetic field with magnetic lines of forces forming a loop-shaped route is formed on a periphery of end parts serving as magnetic poles to cause a magnetic gradient to occur. If the magnetic gradient occurs, it is difficult to remove magnetism only with the differential operations at S102 and S103.

A peripheral magnetic field of the large magnetism generation source and a peripheral magnetic field of a small magnetism generation source have different change ratios of the magnetic gradient depending on a difference in distance between the magnetic poles. That is, in the peripheral magnetic field of the large magnetism generation source with a long distance between the magnetic poles, a distance until a magnetic gradient of one magnetic pole makes a transition to a magnetic gradient of the other magnetic pole is long, and the magnetic gradient mildly changes even on the peripheries of the end parts serving as the magnetic poles. On the other hand, in the peripheral magnetic field of the small magnetism generation source with a short distance between the magnetic poles, the magnetic gradient abruptly changes to increase its change ratio.

According to the filtering process for cutting off low-frequency components (S104), it is possible to remove or suppress components of the magnetic gradient with mild changes in the peripheral magnetic fields at the end parts of the large magnetism generation source such as a bridge or a tunnel. On the other hand, the components of the magnetic gradient with abrupt changes derived from magnetic marker 10 as the small magnetism generation source are not suppressed by the filtering process at S104 but can pass through. In this manner, based on the filtered output values of the filtering process (S104) including many components of the magnetic gradient derived from magnetic marker 10 as the small magnetism generation source can be detected with high reliability.

(2.2) Operation of Calibrating Magnetic Sensors

In the above-described operation of detecting magnetic marker 10, common magnetic noise is removed by obtaining temporal differences and differences in the vehicle-width direction of output values of magnetic sensors Sn, thereby trying to enhance accuracy of detection of magnetic marker 10. However, differential operations have characteristics of amplifying an error. In particular, a differential operation between different magnetic sensors has a problem of expanding an adverse effect of a variation error due to individual differences in magnetic sensors Sn. To suppress the adverse effect by the differential operations before it happens, calibration of magnetic sensors Sn is important.

Processes to be performed by calibration circuit 110 (FIG. 3) to calibrate magnetic sensors Sn include (2.2.1) process under the maintenance mode at the time of factory shipping or maintenance work and (2.2.2) process under the normal mode, which is an operation mode to be performed during a vehicle's use period.

(2.2.1) Process Under Maintenance Mode

The process under the maintenance mode is a process for identifying a magnetic output characteristic (characteristic information) of magnetic-field generation coil Cn by using reference magnetism of Helmholtz coil 60. Since magnetic-field generation coil Cn has high linearity between a current value and a quantity of magnetism, if the magnetic output characteristic is obtained, the quantity of magnetism acting on magnetic sensor Sn can be quantitatively controlled or estimated. For example, a case is described in which, as a magnetism output characteristic of magnetic-field generation coil Cn, quantity of magnetism H is grasped when current with certain current value I is passed. Here, if current with a current value of 0.5I is passed through magnetic-field generation coils Cn, a quantity of magnetism of 0.5H can be acted on the corresponding magnetic sensor Sn from magnetic-field generation coil Cn.

The process under the maintenance mode is performed by using dedicated maintenance device 61 which performs, for example, power supply, operating-mode switching, or the like; magnetic-field generation device 6 which generates a uniform magnetic field; and so forth, as in FIG. 7. Magnetic-field generation device 6 is, for example, a magnetic device including Helmholtz coil 60. Maintenance device 61 is connected to both of sensor array 11 and magnetic-field generation device 6. Maintenance device 61 supplies operating power to sensor array 11, and also intermediates between sensor array 11 and magnetic-field generation device 6 for transmission and reception of status information indicating an operating status.

The process under the maintenance mode is performed in a state in which sensor array 11 is held in a uniform magnetic-field space formed by magnetic-field generation device 6 (FIG. 7). When acquiring status information indicating a standby state in which preparation for energization from magnetic-field generation device 6 to Helmholtz coil 60 has been completed, maintenance device 61 transfers that status information to sensor array 11.

When the status information of magnetic-field generation device 6 indicating the standby state is received, calibration circuit 110 of sensor array 11 causes each magnetic sensor Sn to perform magnetic measurement. With this magnetic measurement, calibration circuit 110 acquires sensor output value R1$n$ when magnetism by Helmholtz coil 60 does not act (FIG. 8, S201). Calibration circuit 110 stores sensor output value R1$n$ as a sensor output of each magnetic sensor Sn in an non-energization state of Helmholtz coil 60 and magnetic-field generation coils Cn. In general, this sensor output value R1$n$ is often not zero, because of external magnetism in nature, offset of the sensor output value, or the like.

Receiving a status information indicating completion of magnetic measurement from sensor array 11, magnetic-field generation device 6 starts energization to Helmholtz coil 60 (S202). Magnetic-field generation device 6 controls an energizing current of Helmholtz coil 60 so that reference magnetism Hk, which is the reference quantity of magnetism, acts on each magnetic sensor Sn of sensor array 11.

A magnetic field generated by Helmholtz coil 60 acts on each magnetic sensor Sn as a bias magnetic field to be superposed on the external magnetic field. Therefore, when reference magnetism Hk of Helmholtz coil 60 is acted on each magnetic sensor Sn, the quantity of magnetism acting on magnetic sensor Sn changes by reference magnetism Hk. That is, reference magnetic differential value (one example of magnetic differential value C) ΔHs, which is an amount of change of magnetism acting on each magnetic sensor Sn when energization to Helmholtz coil 60 starts, becomes ΔHs=Hk. After becoming in a state of acting on each magnetic sensor Sn with reference magnetism Hk, magnetic-field generation device 6 transmits, via maintenance device 61 to calibration circuit 110, status information indicating that energization is being performed.

When receiving the status information of magnetic-field generation device 6 indicating that energization is being performed, calibration circuit 110 causes each magnetic sensor Sn to perform magnetic measurement, thereby acquiring sensor output value R2$n$ (S203). Furthermore, maintenance device 61 calculates, for each magnetic sensor Sn, reference output differential value ΔRsn (=R2$n$−R1$n$, one example of output differential value C), which indicates an amount of change of a sensor output of magnetic sensor Sn when energization to Helmholtz coil 60 starts (S204, sensor characteristic acquiring step).

Calibration circuit 110 stores, for each magnetic sensor Sn, a numerical combination (ΔHs⇔ΔRsn) of reference magnetic differential value ΔHs (common for each magnetic sensor Sn) stored at step S202 described above and reference output differential value ΔRsn calculated at step S204, as a sensor output characteristic indicating characteristic information of each magnetic sensor Sn (S205, sensor characteristic acquiring step). This combination represents the sensor output characteristic that an output differential value of magnetic sensor Sn when the quantity of magnetism acting on magnetic sensor Sn changes by ΔHs is ΔRsn.

When receiving from sensor array 11 status information indicating that the sensor output characteristic (characteristic information) of every magnetic sensor Sn has been completely stored, magnetic-field generation device 6 stops energization to Helmholtz coil 60 (FIG. 7) (S206). When receiving status information indicating that energization to Helmholtz coil 60 has been stopped, sensor array 11 starts energization to magnetic-field generation coils Cn (S207).

Note that since magnetic-field generation coils Cn are connected to be in series, the magnitude of an energization current of each magnetic-field generation coil Cn is equal. As current value I1 to be passed through magnetic-field generation coil Cn, a current value that can act on magnetic sensor Sn with a quantity of magnetism close to reference magnetism Hk by Helmholtz coil 60 is preferably set, based on the design specifications of magnetic-field generation coil Cn such as a number of winding or a coil diameter. If the energization current to magnetic-field generation coil Cn is switched from a current value of zero to current value I1, a current differential value indicating an amount of change of the current value to be passed through magnetic-field generation coil Cn becomes $\Delta Ia=I1$. Note that since magnetic-field generation coils Cn are mutually connected to be in series, current differential value $\Delta Ia$, which is one example of current differential value B, is common for each magnetic-field generation coil Cn. On the other hand, since the magnetic output characteristic varies for each magnetic-field generation coil Cn, the quantity of magnetism with which each magnetic-field generation coil Cn acts on magnetic sensor Sn is not constant but variation occurs.

During a period in which current value I1 is passed to each magnetic-field generation coil Cn, calibration circuit 110 performs magnetic measurement by each magnetic sensor Sn, and acquires sensor output value R3n for each magnetic sensor Sn (S208, magnetic measurement step). Then, calibration circuit 110 performs, for each magnetic sensor Sn, a calculation of subtracting sensor output value R1n (sensor output value at S201 described above) when magnetism from magnetic-field generation coil Cn and Helmholtz coil 60 does not act from sensor output value R3n when magnetism of magnetic-field generation coil Cn acts. With this, output differential value $\Delta Rcn$ (=R3n-R1n, one example of output differential value B), which is an amount of change of the sensor output of magnetic sensor Sn in accordance with current differential value $\Delta Ia$, which is an amount of change of the energization current to magnetic-field generation coil Cn, is acquired for each magnetic sensor Sn (S209, magnetic measurement step).

To estimate magnetic differential value $\Delta Han$ (one example of magnetic differential value B) corresponding to output differential value $\Delta Rcn$ of each magnetic sensor Sn, calibration circuit 110 first refers to the sensor output characteristic ($\Delta Hs \Leftrightarrow \Delta Rsn$) of magnetic sensor Sn stored at step S205 described above (S210, magnetic output characteristic acquiring step). Then, by a proportional calculation based on a sensor output characteristic of magnetic sensor Sn that output differential value $\Delta Rsn$ is generated due to magnetic differential value $\Delta Hs$, magnetic differential value $\Delta Han$ (=$(\Delta Rcn/\Delta Rsn) \times \Delta Hs$) corresponding to output differential value $\Delta Rcn$ (S209 described above) of each magnetic sensor Sn is obtained (S211, magnetic output characteristic acquiring step). Then, calibration circuit 110 stores, as a magnetic output characteristic of magnetic-field generation coil Cn, magnetic differential value $\Delta Han$ and current differential value $\Delta Ia$ in association with each other, thereby storing a numerical combination of both (S212, magnetic output characteristic acquiring step).

With the process under the maintenance mode in the procedure as described being performed, reference magnetism Hk of Helmholtz coil 60 is caused to be measured by magnetic sensor Sn, the sensor output characteristic of each magnetic sensor Sn can be grasped (sensor characteristic acquiring step). Furthermore, if magnetism with which magnetic-field generation coil Cn acts is measured by each magnetic sensor Sn whose sensor output characteristic has been grasped (magnetic measurement step), the magnetic output characteristic of that magnetic-field generation coil Cn can be grasped (magnetic output characteristic acquiring step).

In general, magnetic-field generation coil Cn with an electric wire wound therearound has high linearity in the magnitude of magnetism with respect to a magnitude of current to be passed, and a quantity of magnetism changes substantially in proportion to a current value of energization current. Therefore, according to magnetic-field generation coil Cn whose magnetic output characteristic has been grasped, the quantity of magnetism acting on corresponding magnetic sensor Sn can be quantitatively controlled, and calibration of magnetic sensors Sn is helped.

(2.2.2) Process Under Normal Mode

In a vehicle's use period, various types of magnetism act on each magnetic sensor Sn from inside and outside of vehicle 5. In particular, vehicle 5 has various electronic components on board that can serve as magnetism generation sources. Magnetism from these electronic components may act on magnetic sensors Sn to make their quantity of magnetism larger than a quantity of magnetism acting from magnetic marker 10. Also, since a structure in an RC construction such as a tunnel or a bridge configuring a road can serve as the large magnetism generation source, a magnitude of external magnetism acting from outside on vehicle 5 fluctuates in accordance with a traveling environment.

In general, a sensitivity of a magnetic sensor, that is, a ratio of an amount of change $\Delta R$ of the sensor output value when a quantity of acting magnetism changes by $\Delta H$, can be handled as being constant if $\Delta H$ is small. On the other hand, the sensitivity of magnetic sensor Sn may greatly change in accordance with a level of an absolute value of a quantity of magnetism of a measurement target, that is, a level of a fluctuation range of the quantity of magnetism. Furthermore, this degree of fluctuations of the sensitivity varies for each magnetic sensor Sn due to the individual difference. Thus, if the range of fluctuations of the quantity of magnetism acting on each magnetic sensor Sn is shifted in the use period of vehicle 5, there is a high possibility of occurrence of variation in the sensitivity of each magnetic sensor Sn. If variation occurs in the sensitivity for each magnetic sensor Sn, an error occurs in the time differential value by each differential circuit Dn. And, this error in the time differential value is further enlarged by differential operation by differential circuit Gm, and thus may become a factor in decreasing accuracy of detecting magnetic marker 10.

The process under the normal mode by calibration circuit 110 is performed to enhance uniformity of sensitivity of each magnetic sensor Sn to suppress an error in time differential value during the use period of vehicle 5. This process under normal mode is preferably performed in a situation in which external magnetism acts almost uniformly on each magnetic sensor Sn of sensor array 11. For example, a situation is suitable in which magnetism derived from a relatively small magnetism generation source such as magnetic marker 10 or a manhole, or an end part of the large magnetism generation source such as a bridge in an RC construction does not act on sensor array 11.

As in FIG. 9, first, in a state of non-energization to magnetic-field generation coils Cn, calibration circuit 110 measures magnetism acting almost uniformly from outside to each magnetic sensor Sn, and sequentially stores sensor output value R4n of each sensor Sn (S301). Subsequently, calibration circuit 110 starts energization to magnetic-field generation coils Cn (S302). As current value I2 at this time, current value I1 equal to that at step S207 described above under the maintenance mode may be set, or a different current value may be set. In the present embodiment, current value I2 equal to current value I1 is passed to each magnetic-field generation coil Cn. Thus, current differential value ΔIb (one example of current differential value A), which is an amount of change of current to be passed to each magnetic-field generation coil Cn, becomes ΔIb=I2=I1.

Calibration circuit 110 causes each magnetic sensor Sn to perform magnetic measurement during energization to each magnetic-field generation coil Cn to acquire sensor output value R5n (S303). Then, output differential value ΔRcn (=R5n-R4n, one example of output differential value A) of each magnetic sensor Sn in accordance with the change of current by current differential value ΔIb at a start of energization to magnetic-field generation coil Cn is obtained by calculation (S304).

Calibration circuit 110 refers to the magnetic output characteristic (ΔHan⇔ΔIa) of magnetic-field generation coil Cn stored at step S212 described above under the maintenance mode (S305). Then, by using this magnetic output characteristic, magnetic differential value ΔHbn (one example of magnetic differential value A), which is a change in the quantity of magnetism acting on each magnetic sensor Sn, is estimated by current differential value ΔIb when current value I2 is passed through magnetic-field generation coil Cn at step S302 (S306, magnetic estimation step).

A method of estimating this magnetic differential value ΔHbn assumes that the magnetic differential value changes almost linearly with respect to the current differential value and that a proportional relation between ΔHan and ΔIa in magnetic output characteristic (ΔHan⇔ΔIa) referred to at step S305 is held even if an external environment fluctuates. Magnetic differential value ΔHbn when current differential value ΔIb is acted on magnetic-field generation coil Cn can be estimated by an operation expression of ΔHbn=(ΔIb/ΔIa)×ΔHan. In the present embodiment, since current differential value ΔIa=ΔIb, magnetic differential value ΔHbn is equal to ΔHan.

Calibration circuit 110 obtains an amplification ratio of output differential value ΔRcn so that a ratio between output differential value ΔRcn of magnetic sensor Sn according to step S304 and magnetic differential value ΔHbn estimated as step 306 becomes a predetermined value (S307, calibration step). Then, calibration circuit 110 calibrates each magnetic sensor Sn by setting the amplification ratio of each magnetic sensor Sn obtained by calculation to its corresponding amplifier 242 (S308, calibration step).

Here, the predetermined value at step S307 described above represents the sensitivity of magnetic sensor Sn with respect to acting magnetic differential value ΔHbn. Therefore, if step S307 described above is performed for each magnetic sensor Sn, the sensitivity of every magnetic sensor Sn can be made close to be uniform. Details of this are described with reference to FIGS. 10(a) and 10(b) exemplarily depicting sensor output characteristics of any two magnetic sensors Sα and Sβ (α and β are different natural numbers of 1 to 15) of magnetic sensors Sn. A horizontal axis in the drawings represents quantity of magnetism H acting on the magnetic sensor, and a vertical axis represents sensor output value R of the magnetic sensor.

For example, when an acting quantity of magnetism changes by ΔH (that is when the magnetic differential value is ΔH), if there is a difference in sensitivity in any two magnetic sensors Sα and Sβ, a difference occurs between output differential values ΔRα and ΔRβ, which are amounts of change of output values, as in FIG. 10(a). If the above-described steps S307 and S308 of individually setting the amplification ration for each of magnetic sensors Sα and Sβ are performed, as in FIG. 10(b), amount of change ΔRα' and amount of change ΔRβ' corresponding to the magnetic sensors Sα and Sβ, respectively can be made equal.

By a line of thinking similar to that in the case of FIGS. 10(a) and 10(b), if each magnetic sensor Sn is calibrated so that amount of fluctuation ΔRn of output value Rn of each magnetic sensor Sn when the quantity of magnetism changes by ΔH becomes uniform, it is possible to suppress an error due to variation for each magnetic sensor Sn in the time differential value by differential circuit Dn. If a variation error in the time differential value for each magnetic sensor Sn is suppressed, it is possible to avoid a possibility before it happens that the error is amplified to become excessive when differential circuit Gm obtains a differential value in the vehicle-width direction for a time differential value. By using the differential value in the vehicle-width direction with less error, magnetic marker 10 can be detected with high accuracy by a subsequent filtering process or the like.

Note that calibration circuit 110 repeatedly performs the above-described process under the normal mode when the range of fluctuations of the quantity of magnetism acting magnetic sensors Sn is shifted due to fluctuations in the magnitude of external magnetism or the like, when a regular calibration period comes, and so forth, and performs calibration of magnetic sensors Sn as occasion arises. According to this method of operating marker detection device 1, even if magnetic environmental changes, changes with time, changes of environments such as temperature and humidity, and so forth occur, an error in the time differential value for each magnetic sensor Sn can be avoided, and high detection accuracy can be kept. Also, it is not required to take the vehicle into a maintenance facility or the like for every occasion of maintenance including calibration of magnetic sensors Sn, thereby allowing reduction in time and effort, expense, and so forth on a vehicle user side. A threshold value may be set for a level of the range of fluctuations of the quantity of magnetism. For example, it is also preferable that when the quantity of magnetism when magnetism of the magnetic marker does not act fluctuates by more than the threshold value, it is determined that the range of fluctuations of the quantity of magnetism is shifted and the process under the normal mode is performed.

As described above, marker detection device 1 of the present embodiment is a device including a function of calibrating magnetic sensors Sn. In this marker detection device 1, a state in which each magnetic sensor Sn is favorably calibrated can be kept, and it is thus possible to detect magnetic marker 10 with high accuracy.

In a configuration of the present embodiment according to sensor array 11 including fifteen magnetic sensors, as described above, a configuration is adopted in which respective magnetic-field generation coils Cn are electrically connected in series. When magnetic-field generation coils Cn are connected in series, an equal current can be simultaneously passed through each magnetic-field generation coil Cn, and each magnetic sensor Sn can be efficiently calibrated.

In the process under the maintenance mode, it is preferable that a calibration process is performed in which the sensitivity of each magnetic sensor Sn is made uniform by using reference magnetism Hk with which Helmholtz coil 60 acts on each magnetic sensor Sn. In this calibration process, it is required that the amplification ratio of each amplifier 242 be set so that the output differential value, which is an amount of change of a sensor output outputted by magnetic sensor Sn becomes uniform with respect to magnetic differential value ΔHs with which Helmholtz coil 60 acts on each magnetic sensor Sn. In this case, at step S205 in FIG. 8, a sensor output characteristic after this calibration process is performed is preferably stored.

Note that differential circuits Dn may be omitted based on the configuration of sensor array 11 of the present embodiment. In this case, a time subtraction is not performed for sensor output value Rn of each magnetic sensor Sn, and a subtraction between sensor output values is performed with another magnetic sensor. Therefore, in this case, magnetic sensors Sn are preferably calibrated so that output value Rn of each magnetic sensor Sn is made close to be uniform. To make output value Rn of each magnetic sensor Sn close to be uniform, it is preferable to appropriately set an amplification ratio and an offset value of each amplifier 242 so that output value Rn of each magnetic sensor Sn becomes uniform when magnetism of magnetic marker 10 does not act on sensor array 11.

Note that when the current to be passed to act on magnetic-field generation coils Cn is changed by switching from a non-energization state to an energization state, a current value before the change is zero, and thus a current value after switching to the energization state itself becomes a current differential value. The current differential value in this case corresponds to a current value after switching when magnetic-field generation coils Cn are switched from the non-energization state to the energization state.

As characteristic information indicating a magnetic output characteristic of magnetic-field generation coil Cn forming one example of the magnetic-field generation part, information of a combination of the current differential value acting on magnetic-field generation coil Cn and the magnetic differential value acting on corresponding magnetic sensor Sn is exemplarily described. As characteristic information of magnetic-field generation coil Cn, a combination of the current value to be passed through the magnetic-field generation coil and the quantity of magnetism acting on the magnetic sensor may be used, or a ratio of the magnitude of magnetism acting on magnetic sensor Sn with respect to the current to be passed, that is, sensitivity, may be used. The characteristic information is any information indicating a relation between the current to be passed through magnetic-field generation coil Cn and the magnetism acting on magnetic sensor Sn.

Regarding characteristic information indicating a sensor output characteristic of magnetic sensor Sn, information of a combination of the magnetic differential value acting on magnetic sensor Sn and the output differential value, which is an amount of change of the sensor output outputted by magnetic sensor Sn is exemplarily described. As characteristic information of magnetic sensor Sn, a combination of the quantity of magnetism acting on the magnetic sensor and the sensor output value outputted by the magnetic sensor may be used, or a ratio of the sensor output value with respect to the acting quantity of magnetism may be used. The characteristic information is any information indicating a relation between the magnetism acting on magnetic sensor Sn and the sensor output by the magnetic sensor.

While a configuration provided with differential circuit Gm on a downstream side of differential circuits Dn is exemplarily depicted in the present embodiment, instead of this, a configuration may be adopted in which a differential value in the time direction is calculated by targeting differential values in the width-direction between the output values of magnetic sensors Sn. Note that a process when an order of differential circuits Dn and differential circuits Gm is reversed is equivalent to a process of sensor array 11 of the present embodiment, as will be described further below.

The reversal of the order of the difference circuits is described by assuming, for example, that output values of magnetic sensor S1 at different timings T1 and T2 are R1[T1] and R1[T2] and output values of magnetic sensor S2 in a similar situation are R2[T1] and R2[T2]. Time differential values regarding the output values of magnetic sensors S1 and S2 are (R1[T1]−R1[T2]) and (R2[T1]−R2[T2]), respectively. Thus, a differential value in the vehicle-width direction for these two time differential values is (R2[T1]−R2[T2])−(R1[T1]−R1[T2])=(R2[T1]−R2[T2]−R1[T1]+R1[T2]).

On the other hand, differential values in the vehicle-width direction at timings T1 and T2 regarding the output values of magnetic sensors S1 and S2 are (R2 [T1]−R1 [T1]) and (R2[T2]−R1[T2]), respectively. Therefore, a time differential value for these differential values in the vehicle-width direction is (R2[T1]−R1[T1])−(R2[T2]−R1[T2])=(R2[T1]−R1[T1]−R2[T2]+R1[T2]). This operation expression is equivalent to the above-described operation expression for calculating time differential values and then calculating a differential value in the vehicle-width direction.

While magnetic sensors Sn with sensitivity to the vehicle-width direction are adopted in the present embodiment, magnetic sensors with sensitivity to a forwarding direction may be adopted, or magnetic sensors with sensitivity to a vertical direction may be adopted. Furthermore, for example, magnetic sensors with sensitivity in two axis directions of the vehicle-width direction and the forwarding direction or two axis directions of the forwarding direction and the vertical direction may be adopted and, for example, magnetic sensors with sensitivity in three axis directions of the vehicle-width direction, the forwarding direction, and the vertical direction may be adopted. If magnetic sensors with sensitivity in a plurality of axis directions are used, the magnitude of magnetism and an acting direction of magnetism can be measured, and magnetic vectors can be generated. By using a difference between magnetic vectors or a change ratio of the difference in the forwarding direction, distinction between magnetism of magnetic markers 10 and disturbance magnetism is preferably performed.

While magnetic-field generation coils Cn are exemplarily described as the magnetic-field generation part, the magnetic-field generation part may be any which generates a magnetic field in response to energization, and a simple electric wire may be used. Also, while magnetic-field generation coil Cn is wound around amorphous wire 20 in the present embodiment, amorphous wire may not be arranged to be inserted in magnetic-field generation coil Cn.

Note that the present embodiment is an example of configuration with sensor array 11 and detection unit 12 as separate bodies, a configuration for integrating both may be adopted.

Second Embodiment

The present embodiment is an example in which, based on the configuration of the first embodiment, magnetic-field generation coils Cn are formed with a method similar to that of pickup coil 21 of sensor chip 2. Details of this are described with reference to FIG. 11 and FIG. 12.

In sensor chip 2 of the present embodiment, pickup coil 21 and magnetic-field generation coil Cn are arranged in parallel with respect to amorphous wire 20 forming a magnetically sensitive body.

In sensor chip 2, as depicted in FIG. 11 and FIG. 12, magnetic sensor Sn is formed by using electrode wiring substrate 2A with recessed-groove-shaped extending groove 25 provided to extend. In this sensor chip 2, amorphous wire 20 is buried in an insulator made of epoxy resin or the like with which extending groove 25 is filled. And, with conductive patterns 28 and 29 formed along an outer periphery of the insulator, pickup coil 21 and magnetic-field generation coil Cn are formed.

Conductive patterns include first conductive patterns 28 formed on an inner peripheral surface of extending groove 25 and second conductive patterns 29 formed on an outer side surface of the insulator facing to a front surface side of electrode wiring substrate 2A.

First conductive patterns 28 are patterns formed on the inner peripheral surface of extending groove 25 so as to be substantially orthogonal to a groove direction of extending groove 25 and having both ends provided to extend to a front surface of electrode wiring substrate 2A. First conductive patterns 28 are configured of patterns 282 formed on a bottom surface of extending groove 25 and patterns 281 formed on an inner side surface of extending groove 25. These first conductive patterns 28 are arranged plurally in a row in the groove direction like a ladder.

Second conductive patterns 29 are conductive patterns obliquely going with respect to the groove direction along the outer side surface of the insulator exposed on the front surface side of electrode wiring substrate 2A. As with first conductive patterns 28, second conductive patterns 29 are arranged plurally in a row in the groove direction. Obliquely going with respect to the groove direction, each pattern of second conductive patterns 29 connects two first conductive patterns 28 adjacent to each other in the groove direction in series.

Pickup coil 21 of sensor chip 2 is formed to take a shape of a spiral-like electrical route as a whole with a combination of first and second conductive patterns 28 and 29. In sensor chip 2, amorphous wire 20 is longer than a full length of pickup coil 21. And, magnetic-field generation coil Cn is provided at an end part of amorphous wire 20 extending from pickup coil 21. As with pickup coil 21, this magnetic-field generation coil Cn is formed by a combination of first conductive patterns 28 and second conductive patterns 29, and is different from pickup coil 21 only in the number of winding.

Here, a method of forming first and second conductive patterns 28 and 29 are described. To form first conductive pattern 28, first, a conductive metal thin film is vapor-deposited on an entire inner peripheral surface of extending groove 25 and an edge part of the front surface of electrode wiring substrate 2A adjacent to extending groove 25 before an insulator is formed. Then, a part of the metal thin film is selectively removed by using a selective etching scheme, thereby forming first conductive patterns 28 with plurality of patterns in parallel in a ladder shape. Then, extending groove 25 is filled with epoxy resin or the like so that amorphous wire 20 is buried, thereby forming the insulator.

To form second conductive patterns 29, first, of the front surface of electrode wiring substrate 2A with the insulator formed in extending groove 25, the conductive metal thin film is vapor-deposited on the front surface of the insulator and at an edge part outside extending groove 25. Then, by removing a part of the metal thin film by using the selective etching scheme, second conductive patterns 29 connecting end parts of first conductive patterns 28 adjacent to each other can be formed.

As described above, specifications of magnetic-field generation coil Cn formed by the method similar to that for pickup coil 21 configuring magnetic sensor Sn are identical to those of pickup coil 21, except the number of winding. This magnetic-field generation coil Cn can be made by a similar process to a process when magnetic sensor Sn is made, and thus has less possibility of inducing a cost increase. Also, as magnetic-field generation coil Cn is incorporated in and integrated with magnetic sensor Sn, there is no possibility of fluctuations in clearance distance or the like from magnetic sensor Sn.

With a configuration in which magnetic-field generation coil Cn is wound around amorphous wire 20 of magnetic sensor Sn, it is possible to cause magnetism to efficiently act on magnetic sensor Sn. Incase of this configuration, there is less possibility of fluctuations, due to an external factor or the like, in a ratio of the magnetism supplied to magnetic sensor Sn to the magnetism with which magnetic-field generation coil Cn acts. A configuration as described above in which magnetic-field generation coil Cn is wound around amorphous wire 20 is effective in improving accuracy of calibration using magnetic-field generation coils Cn.

Note that it is not imperative that amorphous wire 20 is arranged to be inserted in magnetic-field generation coil Cn. A length of amorphous wire 20 may be made approximately equivalent to the full length of pickup coil 21 to reduce a portion extending from pickup coil 21. In this case, a state is such that amorphous wire 20 is not arranged to be inserted in magnetic-field generation coil Cn.

Note that other configurations and operations and effects are similar to those of the first embodiment.

In the foregoing, specific examples of the present invention are described in detail as in the embodiments, these specific examples merely disclose examples of technology included in the scope of the claims. Needless to say, the scope of the claims should not be restrictively construed based on configurations, numerical values, and so forth of the specific examples. The scope of the claims includes techniques acquired by variously modifying, changing, or combining as appropriate the above-described specific examples by using known techniques, knowledge of a person skilled in the art, and so forth.

REFERENCE SIGNS LIST 1 marker detection device (marker detection system)
10 magnetic marker
11 sensor array (sensor unit)
110 calibration circuit
112 calibration part (storage part, estimation part)
12 detection unit (detection part)
125 filtering process circuit
127 detection processing circuit
2 sensor chip
20 amorphous wire (magnetic wire)
21 pickup coil (coil)
Sn magnetic sensor
Cn magnetic-field generation coil (magnetic-field generation part, coil)
5 vehicle
6 magnetic-field generation device
60 Helmholtz coil

The invention claimed is:

1. A marker detection system comprising:
a sensor unit configured to detect a magnetic marker laid in a road, the sensor unit including:
a plurality of magnetic sensors for measuring a strength of magnetism; and
a plurality of magnetic-field generators, wherein each of the plurality of magnetic-field generators is:
associated with a corresponding magnetic sensor of the plurality of magnetic sensors; and
configured to receive a passed current and generate a magnetic field based on the passed current;
a memory configured to store characteristic information of each of the plurality of magnetic-field generators indicating a magnetic output characteristic;
wherein the magnetic output characteristic is a relation between the passed current received by the magnetic-field generator and the strength of magnetism from the magnetic field generated by the magnetic-field generator acting on the corresponding magnetic sensor;
a computer processor configured to:
estimate a magnetic differential value A based on the stored characteristic information, wherein:
the magnetic differential value A indicates an amount of change of the strength of magnetism acting on the corresponding magnetic sensor due to a current differential value A; and
the current differential value A indicates an amount of change of the current passed to the magnetic-field generator; and
calibrate each of the plurality of magnetic sensors to enhance uniformity in sensitivity, wherein the uniformity in sensitivity is a ratio between:
an output differential value A; and
the estimated magnetic differential value A for the current differential value A, wherein:
the output differential value A is an amount of change of an output of the corresponding magnetic sensor based on a change in the strength of magnetism from the magnetic field generated by the magnetic field generator; and
the change in the strength of magnetism from the magnetic field is based on a change in the passed current by the current differential value A.

2. The marker detection system according to claim 1, wherein the stored characteristic information of each of the magnetic-field generators is information of a combination of the current differential value and the magnetic differential value.

3. The marker detection system according to claim 2, wherein:
each of the plurality of magnetic-field generators include a coil with an electric wire wound therearound to generate the magnetic field in accordance with energization to the coil,
the plurality of magnetic sensors each include a magnetic wire as a magnetically sensitive body and a coil with an electric wire wound around the magnetic wire, and
the coil of the each of the magnetic sensors and the coil of each of the magnetic-field generators have common specifications except a number of winding.

4. The marker detection system according to claim 1, wherein the plurality of magnetic-field generators are electrically connected in series to each other.

5. The marker detection system according to claim 4, wherein:
each of the plurality of magnetic-field generators includes a coil with an electric wire wound therearound to generate the magnetic field in accordance with energization to the coil,
the plurality of magnetic sensors each includes a magnetic wire as a magnetically sensitive body and a coil with an electric wire wound around the magnetic wire, and
the coil of the each of the magnetic sensors and the coil of each of the magnetic-field generators have common specifications except a number of winding.

6. The marker detection system according to claim 1, wherein the computer processor is further configured to detect the magnetic marker via a calculation process with a differential value between:
the magnetic sensors as an input value; and
a sensor output value of an other of the magnetic sensors or an operation value based on the sensor output value of the other of the magnetic sensors;
wherein the differential value is a difference between a sensor output value of one of the magnetic sensors or an operation value based on the sensor output value.

7. The marker detection system according to claim 1, wherein each of the plurality of magnetic-field generators includes a coil with an electric wire wound therearound to generate the magnetic field in accordance with energization to the coil.

8. The marker detection system according to claim 7, wherein the plurality of magnetic sensors each includes a magnetic wire as a magnetically sensitive body and a coil with an electric wire wound around the magnetic wire, and
the coil of the each of the magnetic sensors and the coil of each of the magnetic-field generators have common specifications except a number of winding.

9. A method of operating a marker detection system, the marker detection system including a sensor unit configured to detect a magnetic marker laid in a road, the sensor unit including a plurality of magnetic sensors which measure strength of magnetism, a plurality of magnetic-field generators each associated with a corresponding magnetic sensor of the plurality of magnetic sensors of the sensor unit and each configured to receive a passed current and generates a magnetic field based on the passed current, a computer processor, and a memory configured to store characteristic information of each of the plurality of magnetic-field generators indicating a magnetic output characteristic, wherein the magnetic output characteristic is a relation between the passed current received by the magnetic-field generator and the strength of magnetism from the magnetic field generated by the magnetic-field generator acting on the corresponding magnetic sensor, the method comprising:
estimating with the computer processor a magnetic differential value A based on the stored characteristic information, wherein:
the magnetic differential value A indicates an amount of change of the strength of magnetism acting on the corresponding magnetic sensor due to a current differential value A; and
the current differential value A indicates an amount of change of the current passed to the magnetic-field generator; and
calibrate with the computer processor each of the plurality of magnetic sensors to enhance uniformity in sensitivity, wherein the uniformity in sensitivity is a ratio between:

an output differential value A; and
the estimated magnetic differential value A for the current differential value A, wherein:
the output differential value A is an amount of change of an output of the corresponding magnetic sensor based on a change in the strength of magnetism from the magnetic field generated by the magnetic field generator; and
the change in the strength of magnetism from the magnetic field is based on a change in the passed current by the current differential value A.

10. The method of operating the marker detection system according to claim 9, wherein the stored characteristic information of each of the magnetic-field generators is information of a combination of the current differential value, and the magnetic differential value.

11. The method of operating the marker detection system according to claim 10, further comprising:
acquiring with the computer processor the characteristic information of each of the plurality of magnetic sensors indicating a sensor output characteristic by measuring an amount of change serving as a reference of the sensor output, of each of the plurality of magnetic sensors when the magnetism acting on the magnetic sensor is changed by a reference amount;
wherein the sensor output characteristic is a relation between the strength of magnetism acting on each of the plurality of magnetic sensors and a sensor output outputted by each of the plurality of magnetic sensors,
measuring with the computer processor the strength of the magnetism acting on each of the plurality of corresponding magnetic sensors when the passed current received by the magnetic-field generator is changed and acquiring an output differential value B, wherein:
the output differential value B is an amount of change of the sensor output outputted by the magnetic sensor in accordance with a current differential value B; and
the current differential value B is an amount of change of the current passed to the magnetic-field generator; and
estimating with the computer processor a magnetic differential value B corresponding to the acquired output differential value B with reference to the characteristic information indicating the sensor output characteristic of the corresponding magnetic sensor;
acquiring with the computer processor a combination of the magnetic differential value B and the current differential value B as the characteristic information indicating a magnetic output characteristic of the magnetic-field generator, and
storing the combination in the memory.

12. The method of operating the marker detection system according to claim 11, wherein:
the characteristic information of the corresponding magnetic sensor is information of a combination of a magnetic differential value C corresponding to the reference amount and an output differential value C;
the output differential value C is an amount of change serving as a reference of the sensor output outputted by the corresponding magnetic sensor, and
the acquiring of the characteristic information of each of the plurality of magnetic sensors further includes calibrating each of the plurality of magnetic sensors by making more uniform a ratio between the magnetic differential value C and the output differential value C for each of the plurality of magnetic sensors.

13. The method of operating the marker detection system according to claim 9, further comprising:
acquiring with the computer processor the characteristic information of each of the plurality of magnetic sensors indicating a sensor output characteristic by measuring an amount of change, serving as a reference of the sensor output, of each of the plurality of magnetic sensors when the magnetism acting on the magnetic sensor is changed by a reference amount;
wherein the sensor output characteristic is a relation between the strength of magnetism acting on each of the plurality of magnetic sensors and a sensor output outputted by each of the plurality of magnetic sensors,
measuring with the computer processor the strength of the magnetism acting on each of the plurality of magnetic sensors when the passed current received by the magnetic-field generator is changed and acquiring an output differential value B, wherein:
the output differential value B is an amount of change of the sensor output outputted by the magnetic sensor in accordance with a current differential value B; and
the current differential value B is an amount of change of the current passed to the magnetic-field generator;
estimating with the computer processor a magnetic differential value B corresponding to the acquired output differential value B with reference to the characteristic information indicating the sensor output characteristic of the corresponding magnetic sensor;
acquiring with the computer processor a combination of the magnetic differential value B and the current differential value B as the characteristic information indicating a magnetic output characteristic of the magnetic-field generator; and
storing the combination in the memory.

14. The method of operating the marker detection system according to claim 13, wherein:
the characteristic information of the corresponding magnetic sensor is information of a combination of a magnetic differential value C corresponding to the reference amount and an output differential value C;
the output differential value C is an amount of change serving as a reference of the sensor output outputted by the corresponding magnetic sensor, and
the acquiring of the characteristic information of each of the plurality of magnetic sensors further includes calibrating each of the plurality of magnetic sensors by making more uniform a ratio between the magnetic differential value C and the output differential value C for each of the plurality of magnetic sensors.

15. The method of operating the marker detection system according to claim 14, wherein the marker detection system detects the magnetic marker laid in the road by using the sensor unit, the system comprising:
a memory configured to store characteristic information of each of the plurality of the magnetic-field generators indicating a magnetic output characteristic;
wherein the magnetic output characteristic is a relation between the current passed to the magnetic-field generator and a strength of magnetism acting on the corresponding magnetic sensor;
a computer processor configured to:
estimate a magnetic differential value A based on the stored characteristic information, wherein:
the magnetic differential value A indicates an amount of change of the strength of the magnetism acting on the corresponding magnetic sensor due to a current differential value A; and the current differential value A indicates an amount of change of the current passed to the magnetic-field generator; and calibrate each of the plurality of magnetic sensors to enhance uniformity in sensitivity, wherein the uniformity in sensitivity is a ratio between:

an output differential value A; and the estimated magnetic differential value A for the current differential value A, wherein:

the output differential value A is an amount of change of an output of the corresponding magnetic sensor based on a change in the strength of magnetism from the magnetic field generated by the magnetic field generator; and the change in the strength of magnetism from the magnetic field is based on a change in the passed current by the current differential value A.

16. The method of operating the marker detection system according to claim 13, wherein the marker detection system detects the magnetic marker laid in the road by using the sensor unit, the system comprising:

a memory configured to store characteristic information of each of the plurality of the magnetic-field generators indicating a magnetic output characteristic;

wherein the magnetic output characteristic is a relation between the current passed to the magnetic-field generator and a strength of magnetism acting on the corresponding magnetic sensor of;

a computer processor configured to:

estimate a magnetic differential value A based on the stored characteristic information, wherein:

the magnetic differential value A indicates an amount of change of the strength of the magnetism acting on the corresponding magnetic sensor due to a current differential value A; and the current differential value A indicates an amount of change of the current passed to the magnetic-field generator; and calibrate each of the plurality of magnetic sensors to enhance uniformity in sensitivity, wherein the uniformity in sensitivity is a ratio between:

an output differential value A; and the estimated magnetic differential value A for the current differential value A, wherein:

the output differential value A is an amount of change of an output of the corresponding magnetic sensor based on a change in the strength of magnetism from the magnetic field generated by the magnetic field generator; and the change in the strength of magnetism from the magnetic field is based on a change in the passed current by the current differential value A.

17. The method of operating the marker detection system according to claim 16, wherein:

each of the plurality of magnetic-field generators includes a coil with an electric wire wound therearound to generate the magnetic field in accordance with energization to the coil, the plurality of magnetic sensors each includes a magnetic wire as a magnetically sensitive body and a coil with an electric wire wound around the magnetic wire, and the coil of the each of the magnetic sensors and the coil of each of the magnetic-field generators have common specifications except a number of winding.

18. The method of operating the marker detection system according to claim 9, wherein the marker detection system detects the magnetic marker laid in the road by using the sensor unit, the system comprising:

a memory configured to store characteristic information of each of the plurality of the magnetic-field generators indicating a magnetic output characteristic;

wherein the magnetic output characteristic is a relation between the current passed to the magnetic-field generator and a strength of magnetism acting on the corresponding magnetic sensor;

a computer processor configured to:

estimate a magnetic differential value A based on the stored characteristic information, wherein:

the magnetic differential value A indicates an amount of change of the strength of the magnetism acting on the corresponding magnetic sensor due to a current differential value A; and the current differential value A indicates an amount of change of the current passed to the magnetic-field generator; and calibrate each of the plurality of magnetic sensors to enhance uniformity in sensitivity, wherein the uniformity in sensitivity is a ratio between:

an output differential value A; and the estimated magnetic differential value A for the current differential value A, wherein:

the output differential value A is an amount of change of an output of the corresponding magnetic sensor based on a change in the strength of magnetism from the magnetic field generated by the magnetic field generator; and the change in the strength of magnetism from the magnetic field is based on a change in the passed current by the current differential value A.

19. The method of operating the marker detection system according to claim 18, wherein the stored characteristic information of each of the magnetic-field generators is information of a combination of the current differential value and the magnetic differential value.

20. The method of operating the marker detection system according to claim 18, wherein:

each of the plurality of magnetic-field generators include a coil with an electric wire wound therearound to generate the magnetic field in accordance with energization to the coil, the plurality of magnetic sensors each includes a magnetic wire as a magnetically sensitive body and a coil with an electric wire wound around the magnetic wire, and the coil of the each of the magnetic sensors and the coil of each of the magnetic-field generators have common specifications except a number of winding.

\* \* \* \* \*